United States Patent [19]

Masumi

[11] Patent Number: 5,244,870
[45] Date of Patent: * Sep. 14, 1993

[54] SUPERCONDUCTIVE OPTOELECTRONIC DEVICE WITH THE BASIC SUBSTANCE $CU_2O$ OF SUPERCONDUCTIVE-CONJUGATE PHOTOCONDUCTIVITY

[75] Inventor: Taizo Masumi, Yokohama, Japan
[73] Assignee: The University of Tokyo, Tokyo, Japan
[*] Notice: The portion of the term of this patent subsequent to Feb. 5, 2008 has been disclaimed.
[21] Appl. No.: 698,216
[22] Filed: May 10, 1991

[30] Foreign Application Priority Data

May 11, 1990 [JP] Japan .................. 2-122074

[51] Int. Cl.$^5$ ............. H01L 39/22; H01L 39/12; H01B 12/00
[52] U.S. Cl. ..................... 505/1; 505/702; 257/35; 257/39
[58] Field of Search ............ 357/5; 427/74, 126.3, 427/160, 162, 162.74; 505/702.1, 832, 1, 702

[56] References Cited

U.S. PATENT DOCUMENTS

| 4,651,172 | 3/1987 | Watanabe et al. ............ 427/162 |
| 4,990,487 | 2/1991 | Masumi ..................... 357/5 |

FOREIGN PATENT DOCUMENTS

| 0291050 | 11/1988 | European Pat. Off. . |
| 0332448 | 9/1989 | European Pat. Off. . |
| 62-199070 | 9/1987 | Japan ..................... 357/5 |
| 63-276285 | 11/1988 | Japan ..................... 357/5 |
| 63-280472 | 11/1988 | Japan ..................... 357/5 |
| 1-152321 | 6/1989 | Japan ..................... 357/5 |
| 1-155666 | 6/1989 | Japan ..................... 357/5 |
| 2-260472 | 10/1990 | Japan ..................... 357/5 |

OTHER PUBLICATIONS

"The Color of Polarization in Cuprate Superconductors", AMSAHTS '90 Journal of the Physical Society of Japan, vol. 60, No. 11, pp. 3633-3636 (Nov., 1991).

Journal of the Physical Socety of Japan, vol. 58, No. 5, pp. 1717-1724 (May 1989).

Japanese Journal of Applied Physics Letters, vol. 26, No. 8, Aug. 1987, Tokyo, JP pp. 1320-1322; Nishino T. et al.; Light Detection by Superconducting Weak Link Fabricated with High-Critical-Temperature Oxide-Suerpconductor Film.

Primary Examiner—Rolf Hille
Assistant Examiner—Mahshid Saadat
Attorney, Agent, or Firm—Sughrue, Mion, Zinn, Macpeak & Seas

[57] ABSTRACT

The disclosed superconductive optoelectronic device stems from the inventor's important discovery of a phenomenon that the basic substance $Cu_2O$ reveals photoconductivity below several temperatures $T_{ps}$ in steps thereof, $T_{ps}$ being comparable with a series of the critical temperatures of superconductivity $T_{sc}$ of relevant Cu-based superconductors, and such photoconductivity of the basic substance is in a conjugate relationship with the superconductivity of the above Cu-based superconductors. The device of the invention has a gate region made of the above basic substance $Cu_2O$ and a source region and a drain region made of the above Cu-based superconductors, the source and drain regions connected to each other, so that electric current therebetween at a temperature below the step temperature $T_{ps}$ of the basic substance is switched and/or controlled by the incident light intensity illuminated to the gate region. Also disclosed is an apparatus carrying a plurality with diversity of the above superconductive optoelectronic devices formed therein of an organized space-integration at ultrahigh density, in the form of arrays, and the like, to further develop effectively a new field of "Superconductive Optoelectronics".

17 Claims, 27 Drawing Sheets

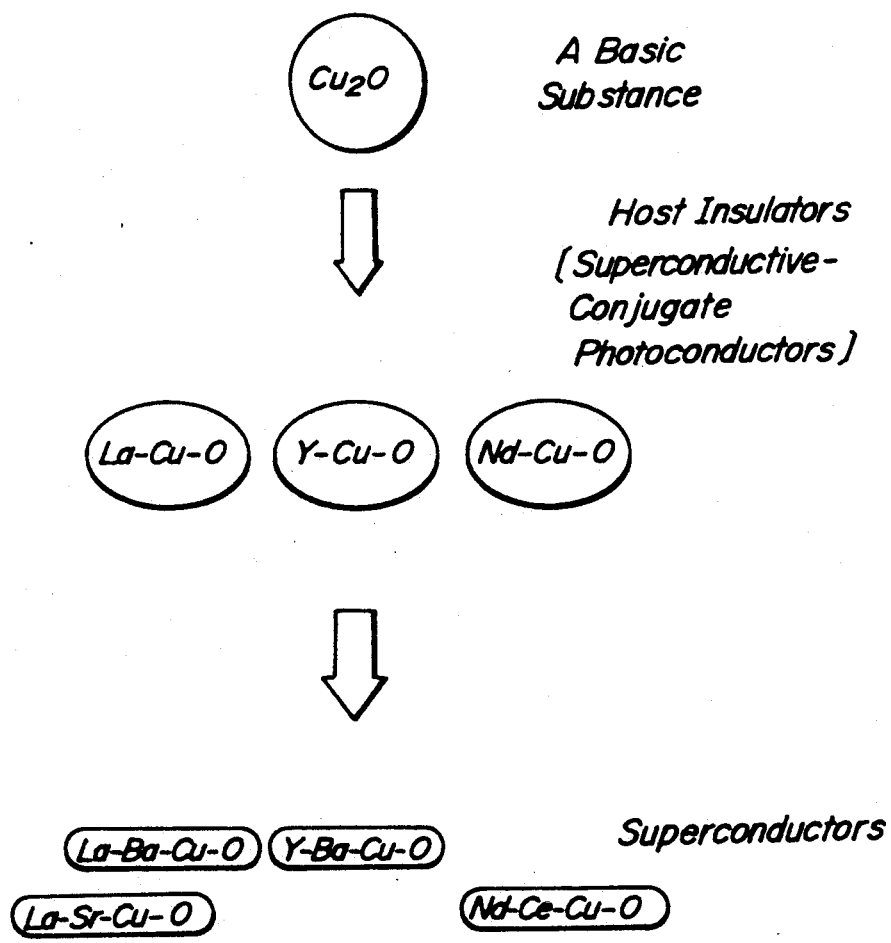

FIG_2A
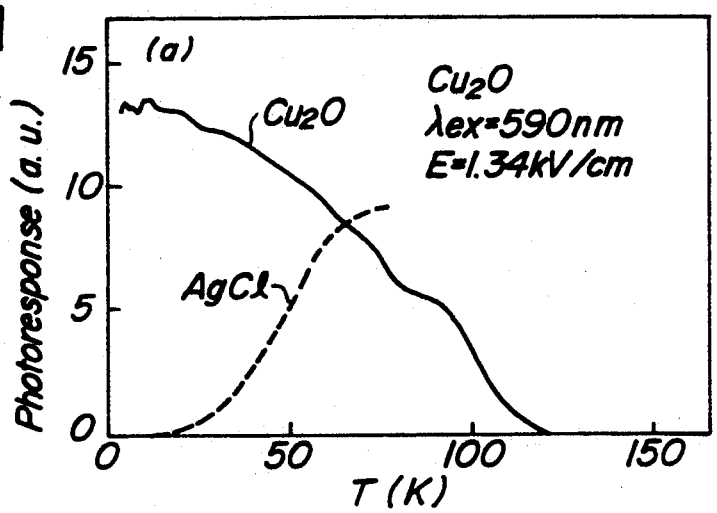
FIG_2B
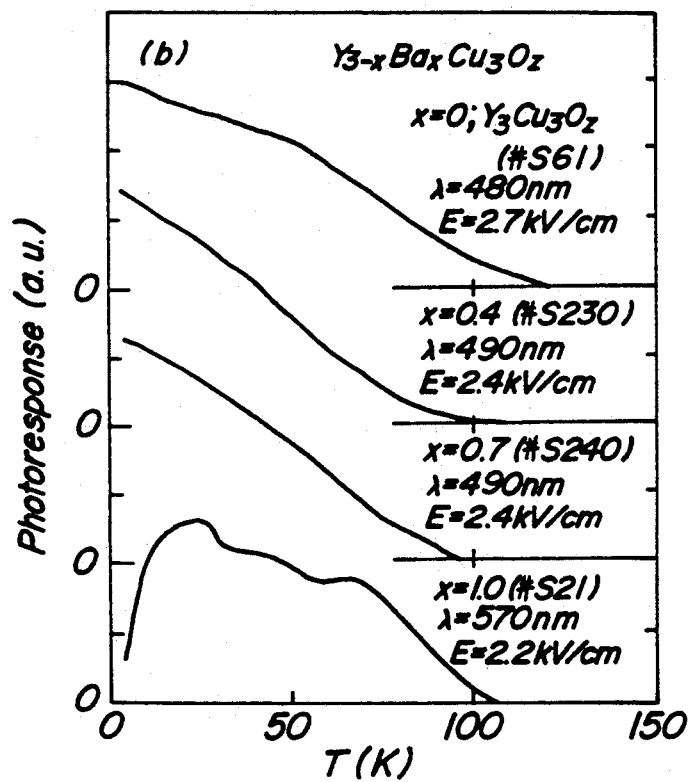
FIG_2C
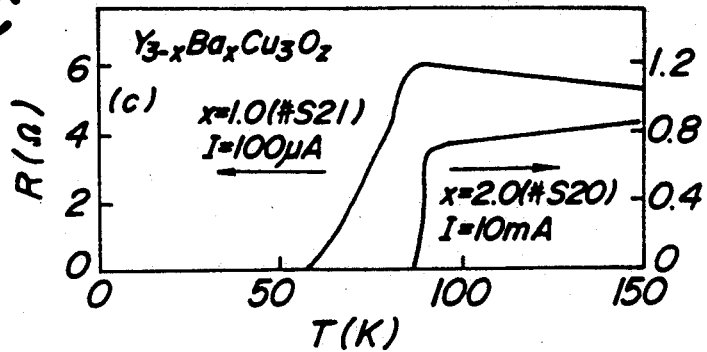

FIG_4A
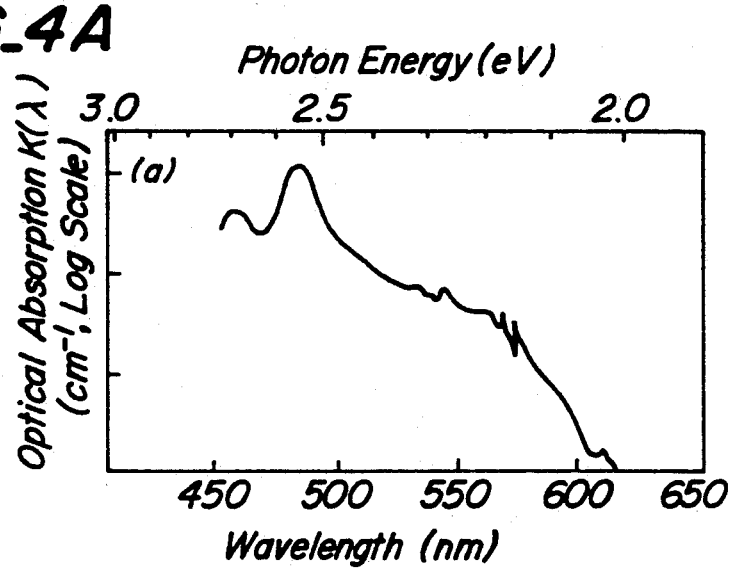
FIG_4B
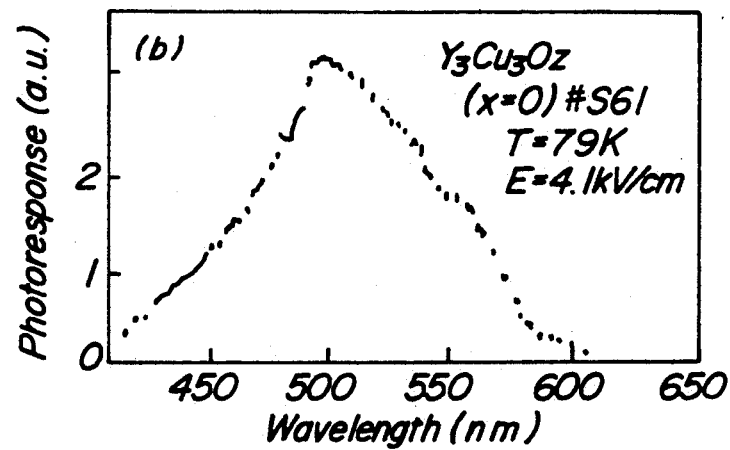
FIG_4C
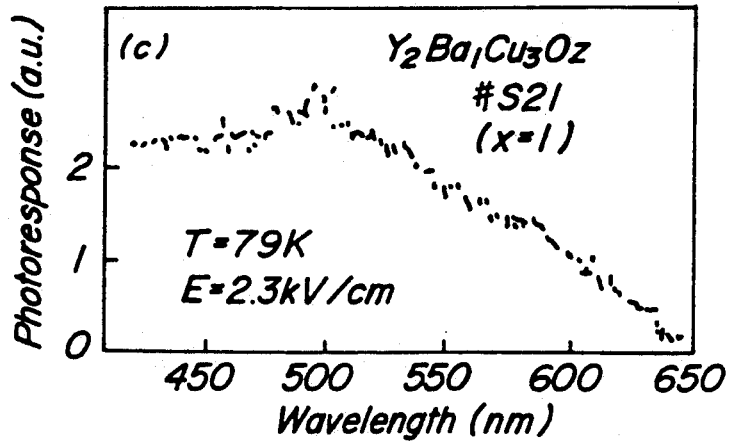

FIG._5
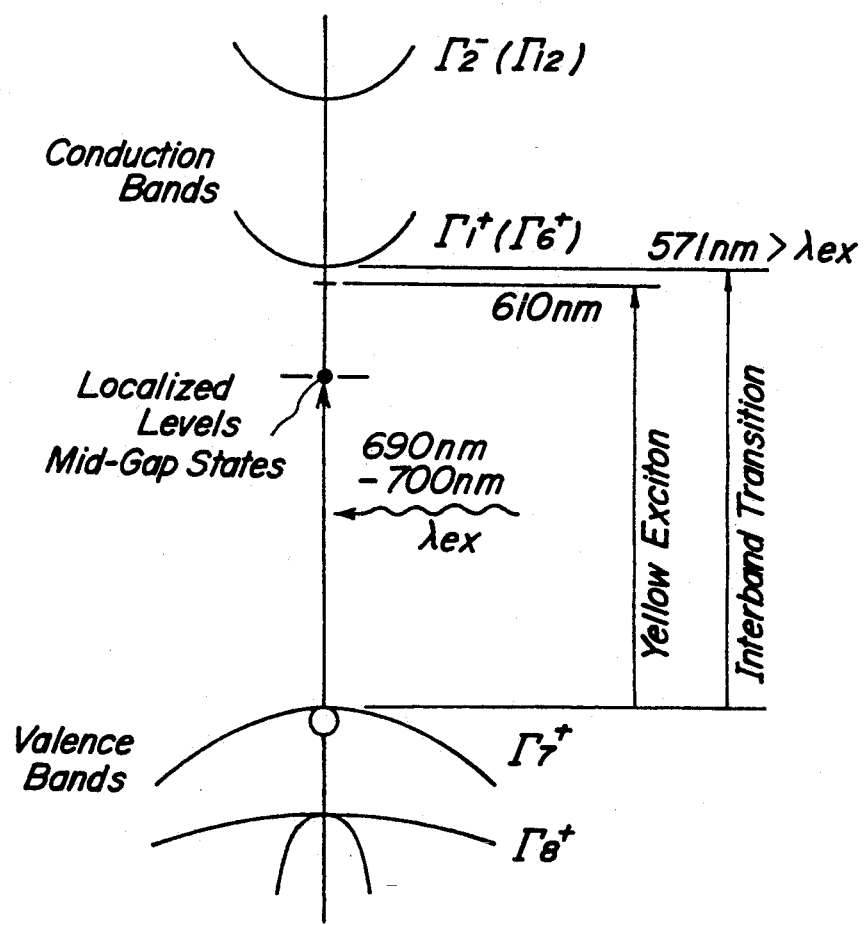

FIG_6A
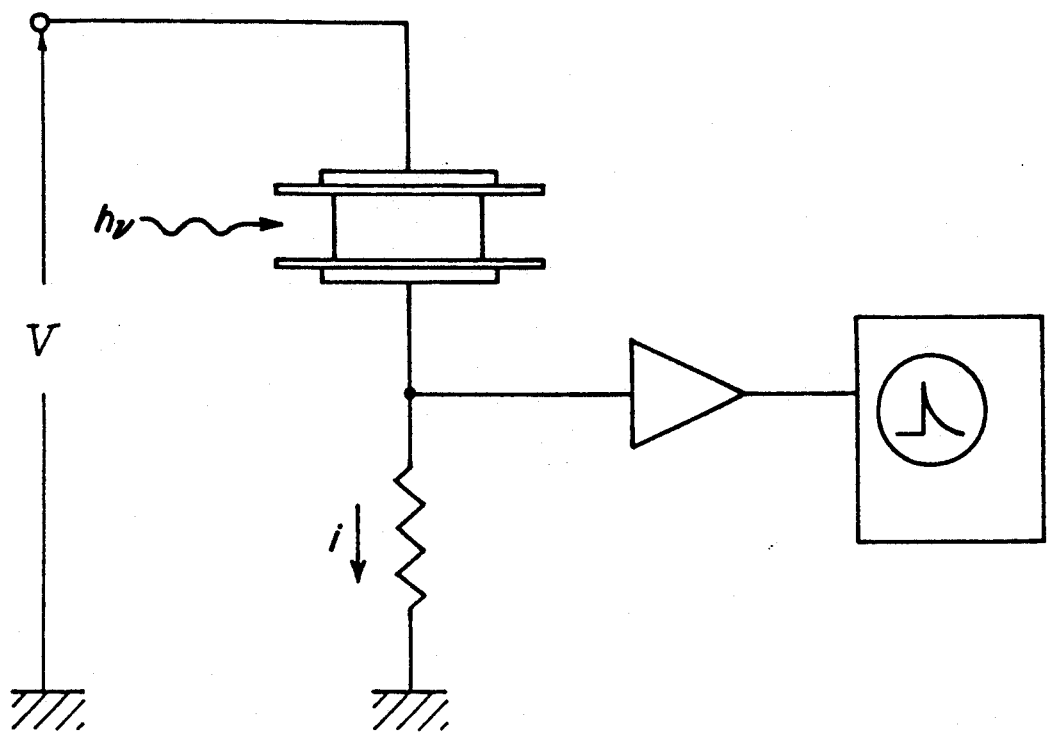
FIG_6B
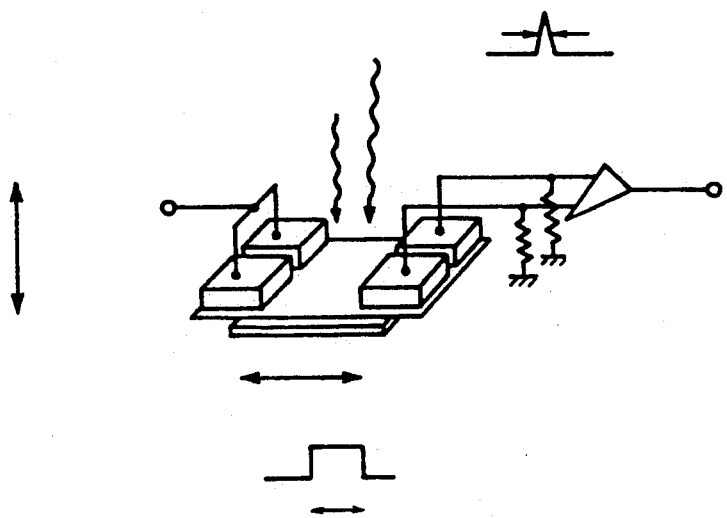

FIG_7
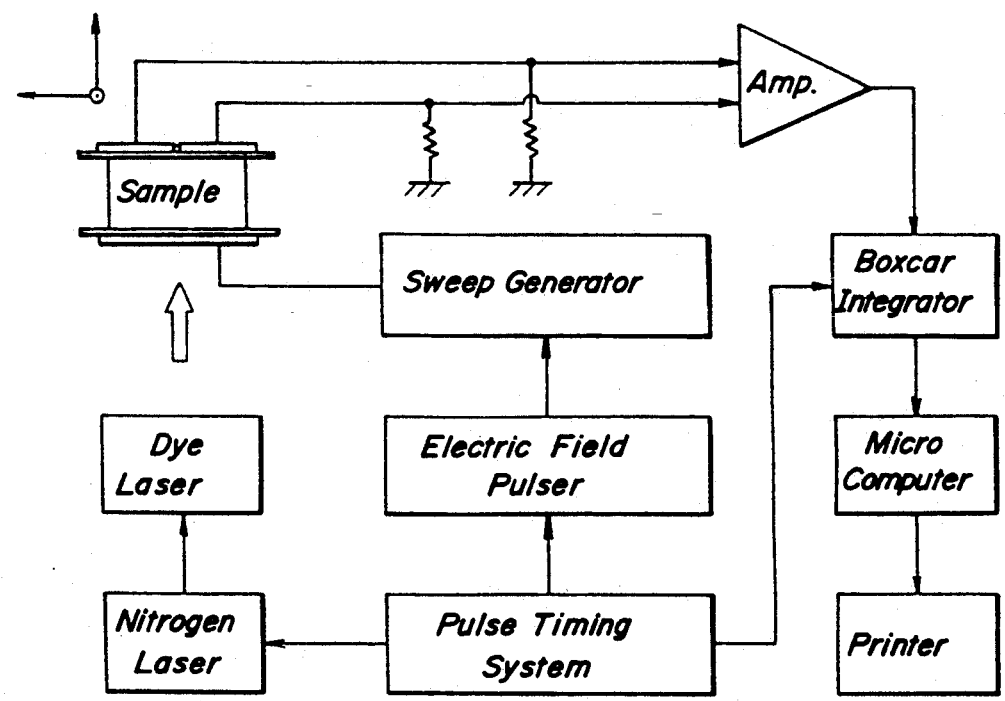

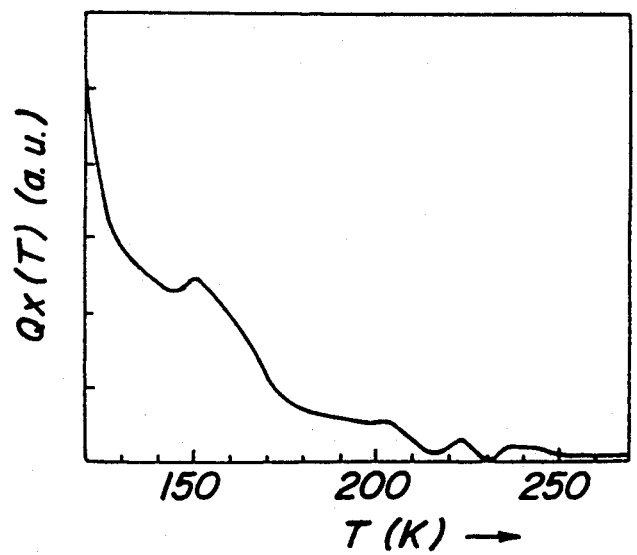
FIG_8B

FIG_10 A
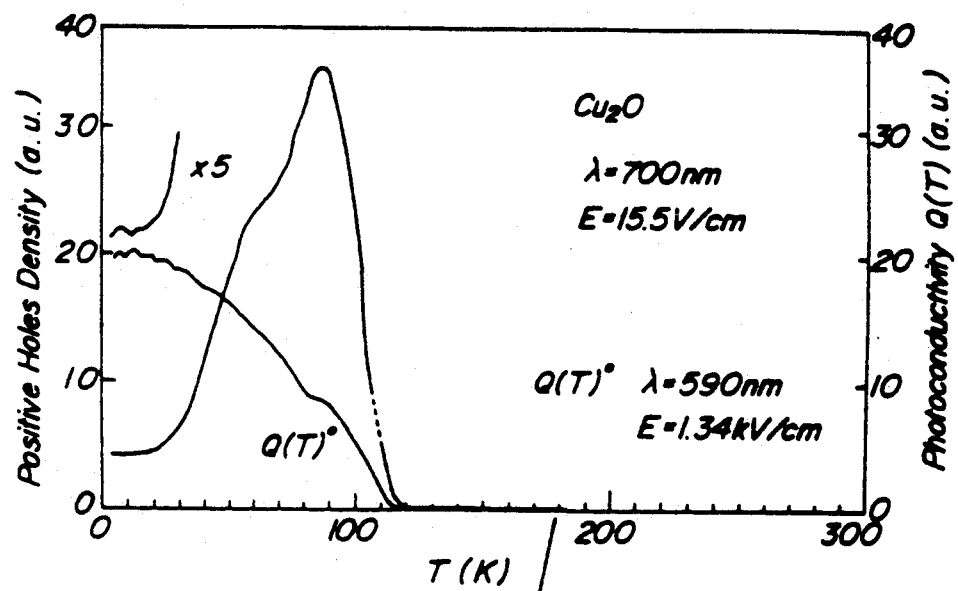
FIG_10 B
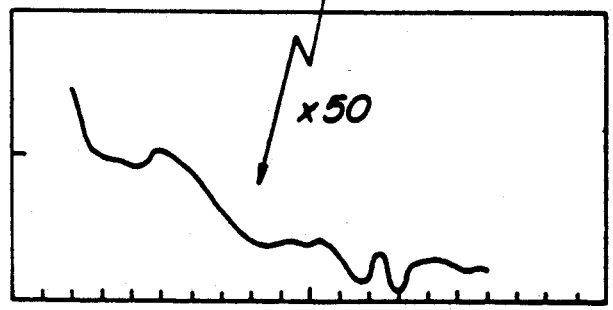

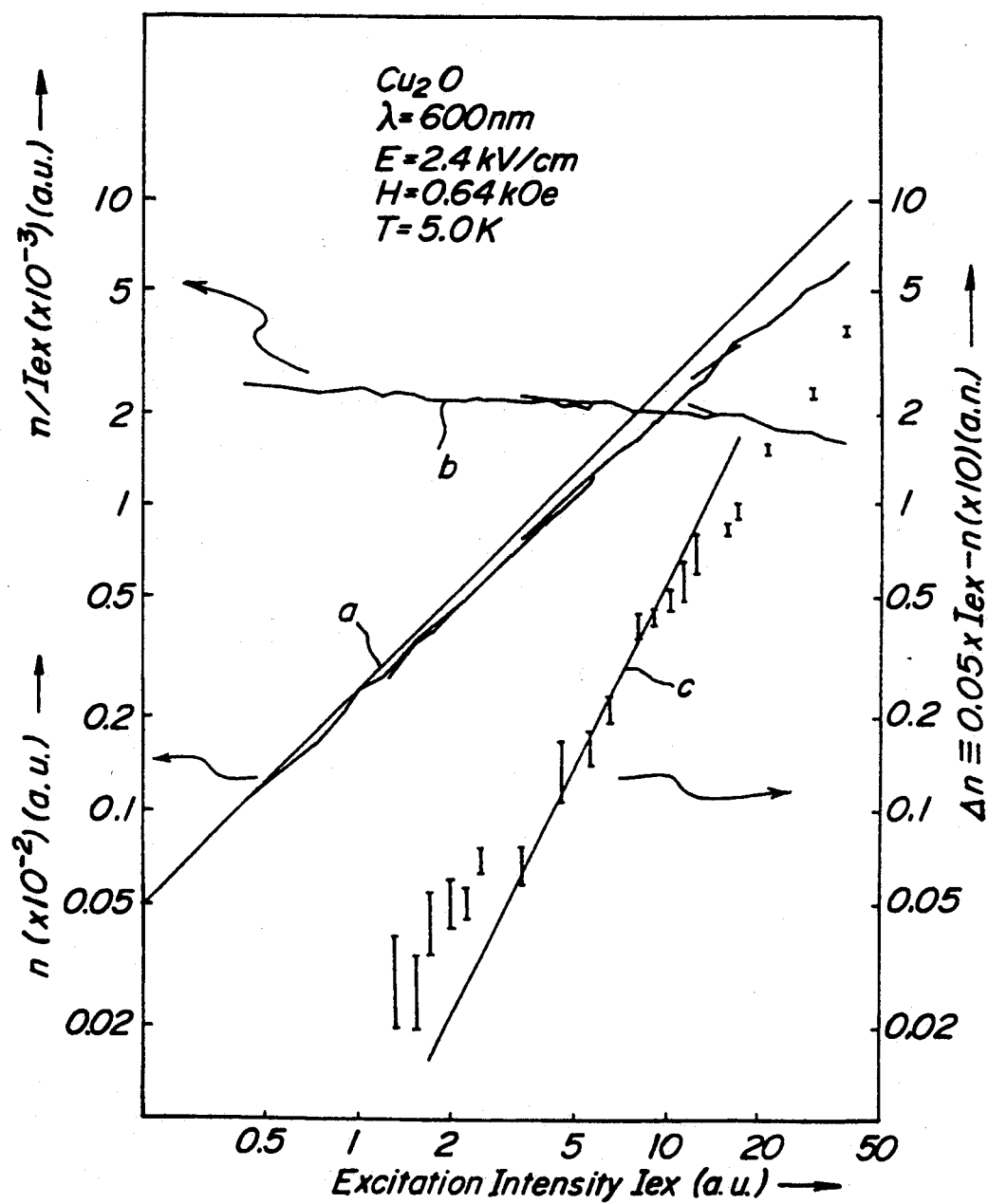
FIG_11A

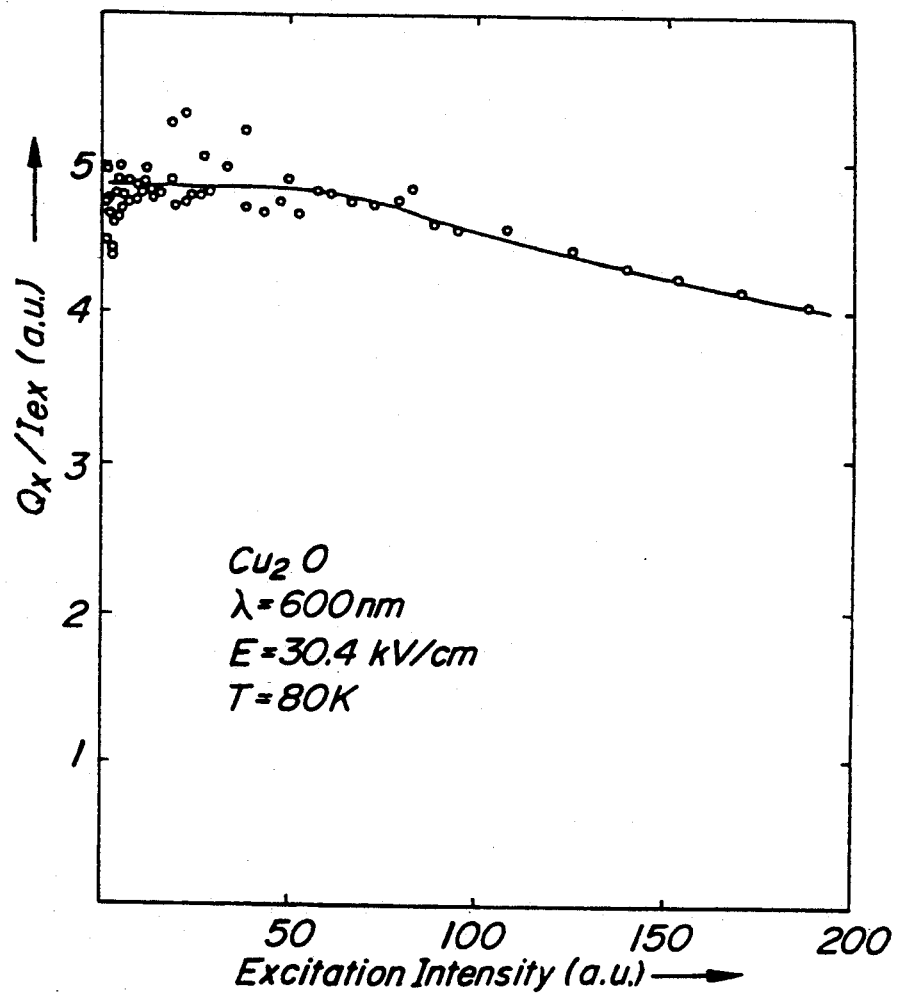
FIG_11B

FIG_12
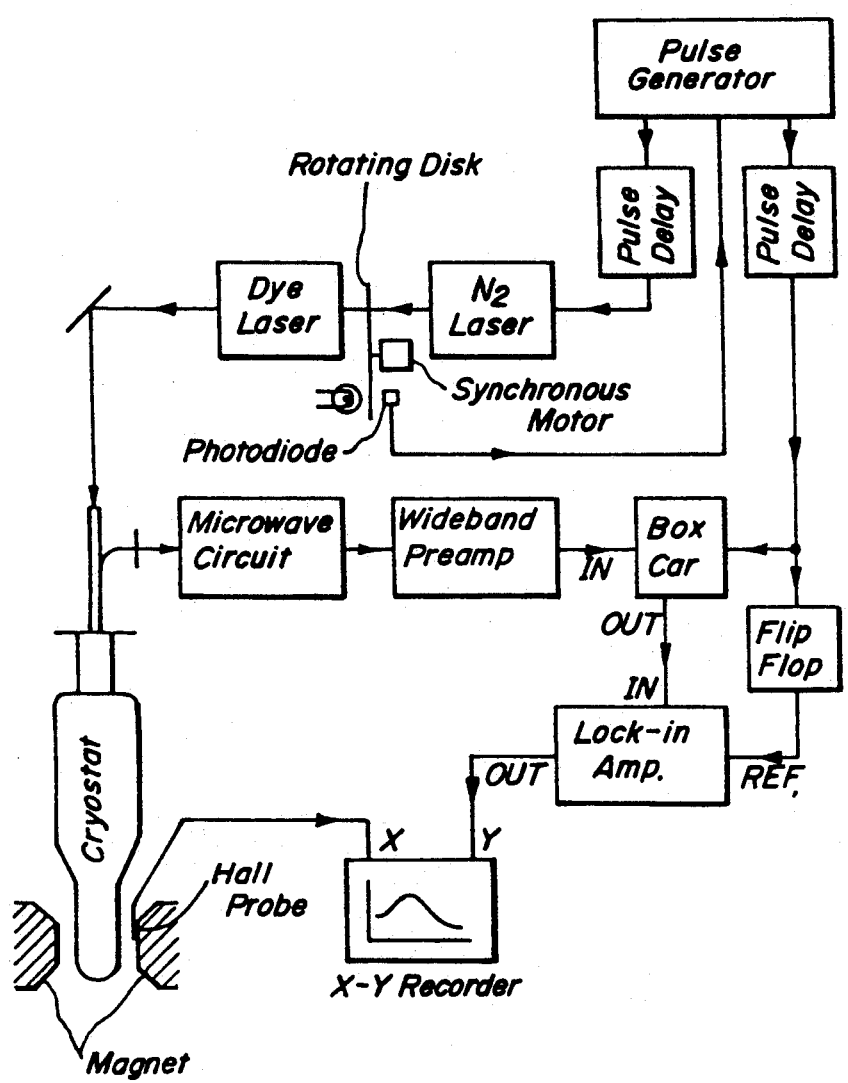

FIG_14A
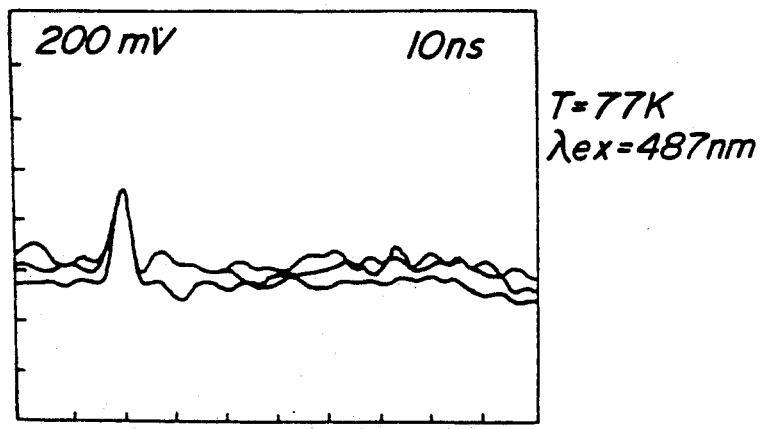
T=77K
λex=487nm
FIG_14B
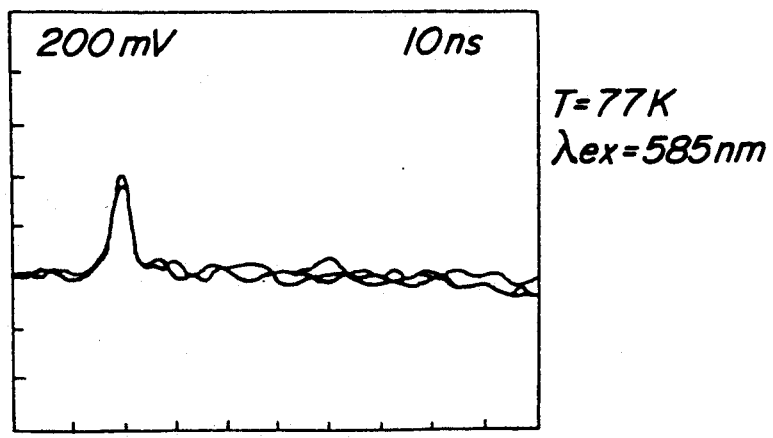
T=77K
λex=585nm

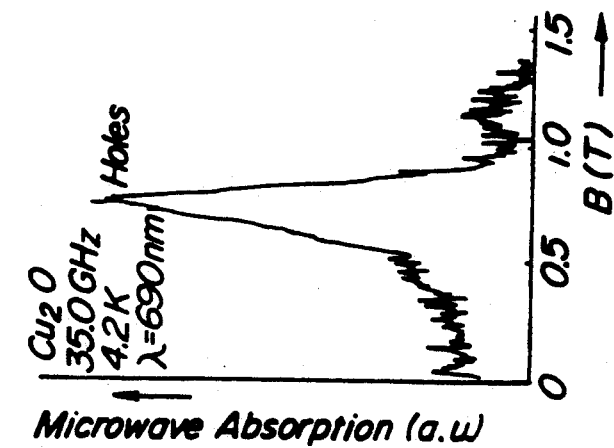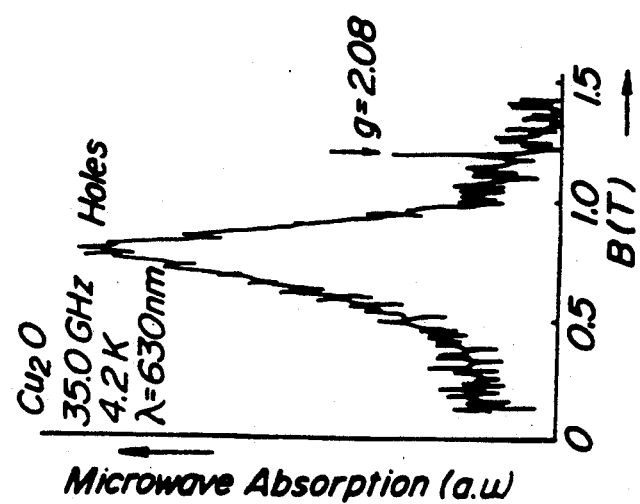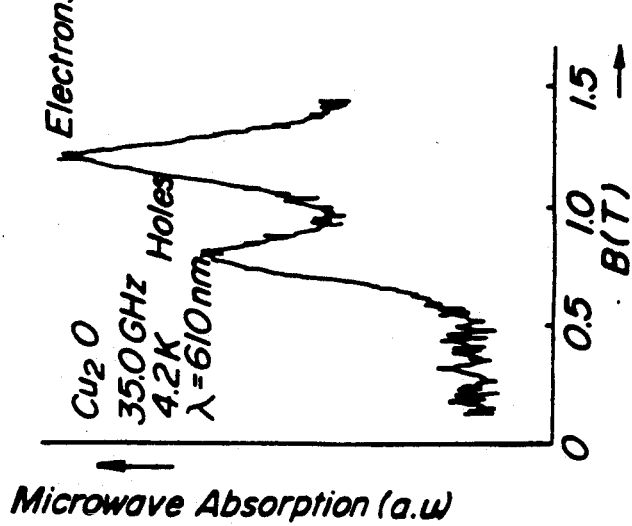

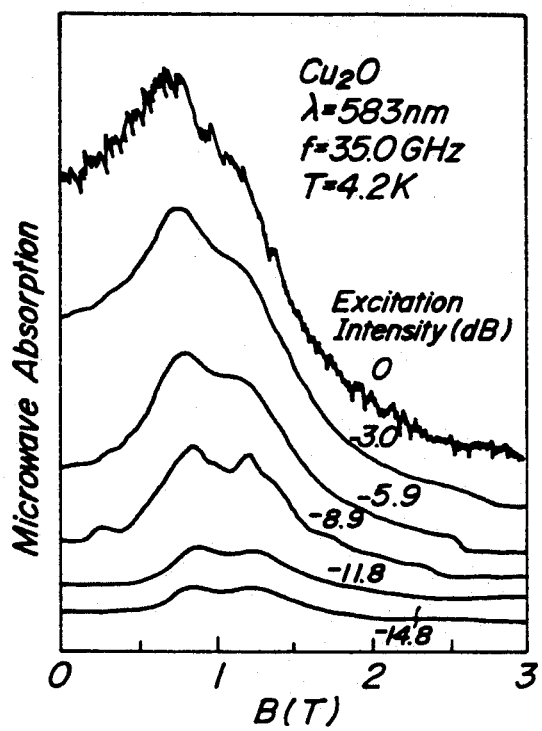
FIG_16A
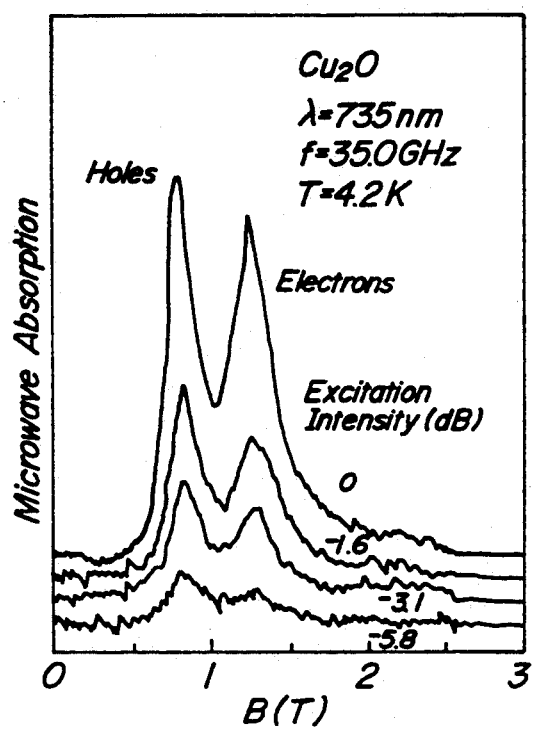
FIG_16B
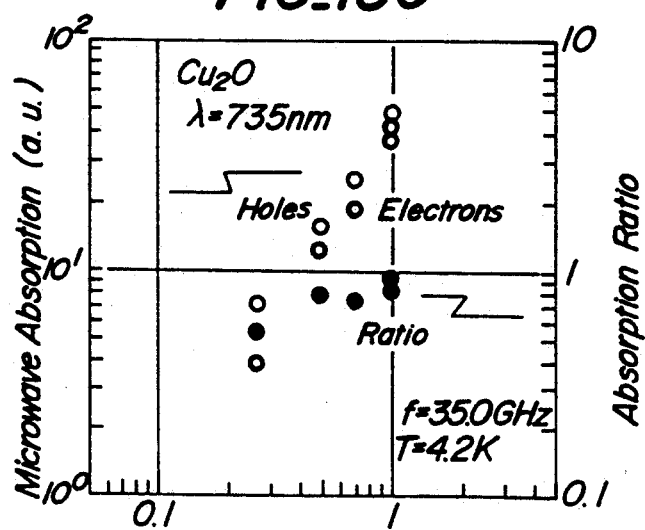
FIG_16C

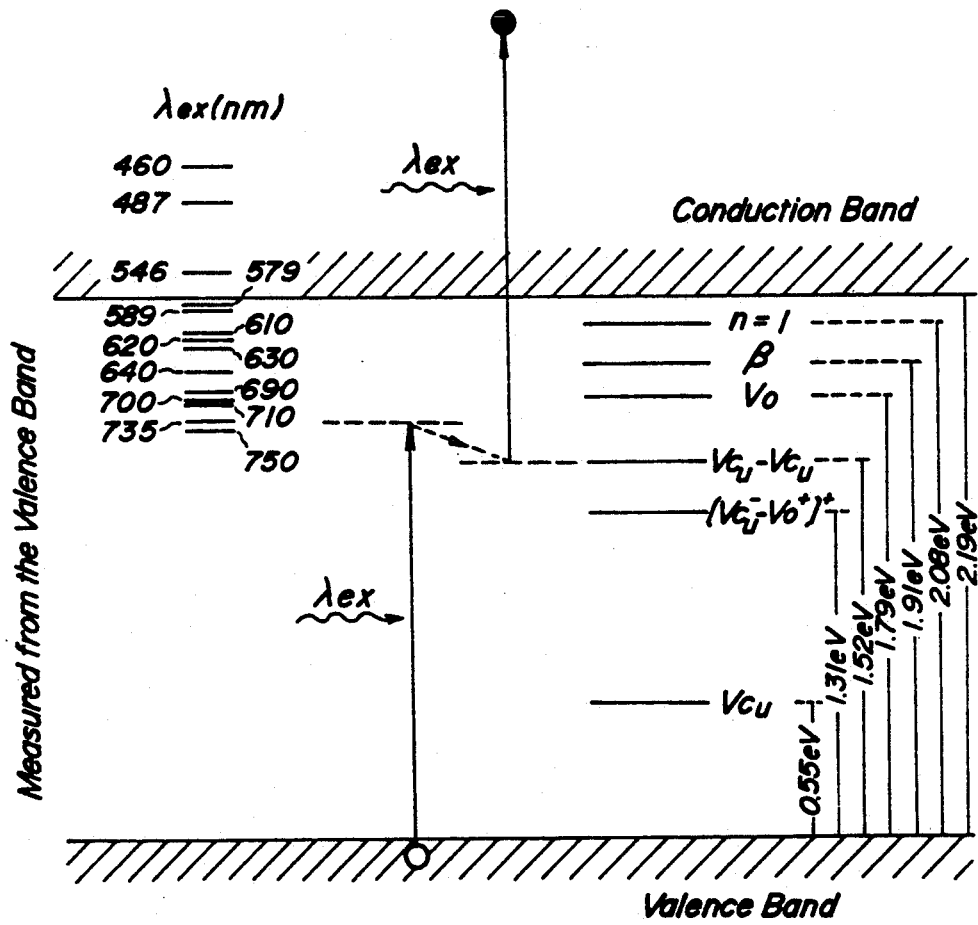
FIG_17

FIG_18
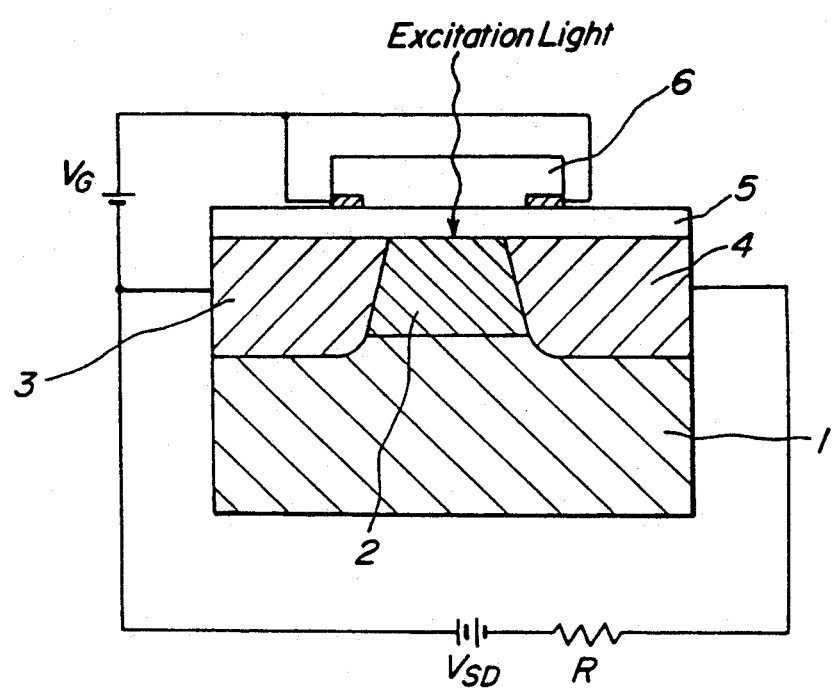
FIG_19
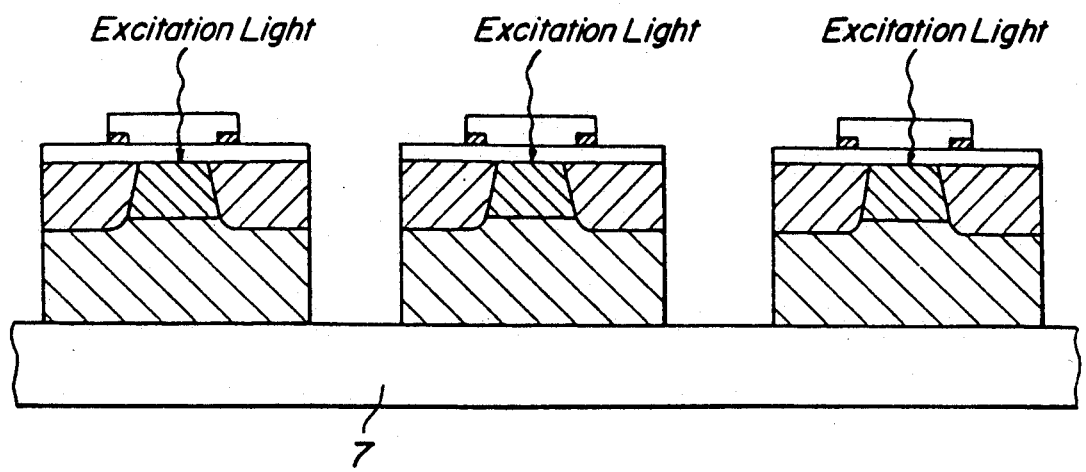

FIG_20A
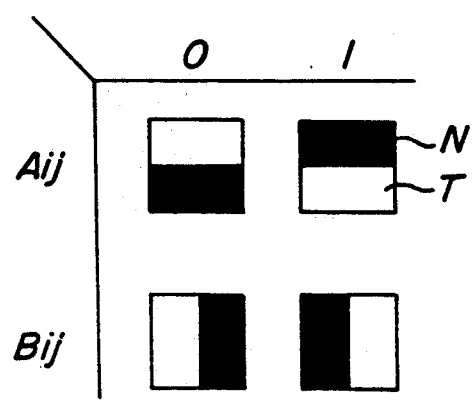
FIG_20B
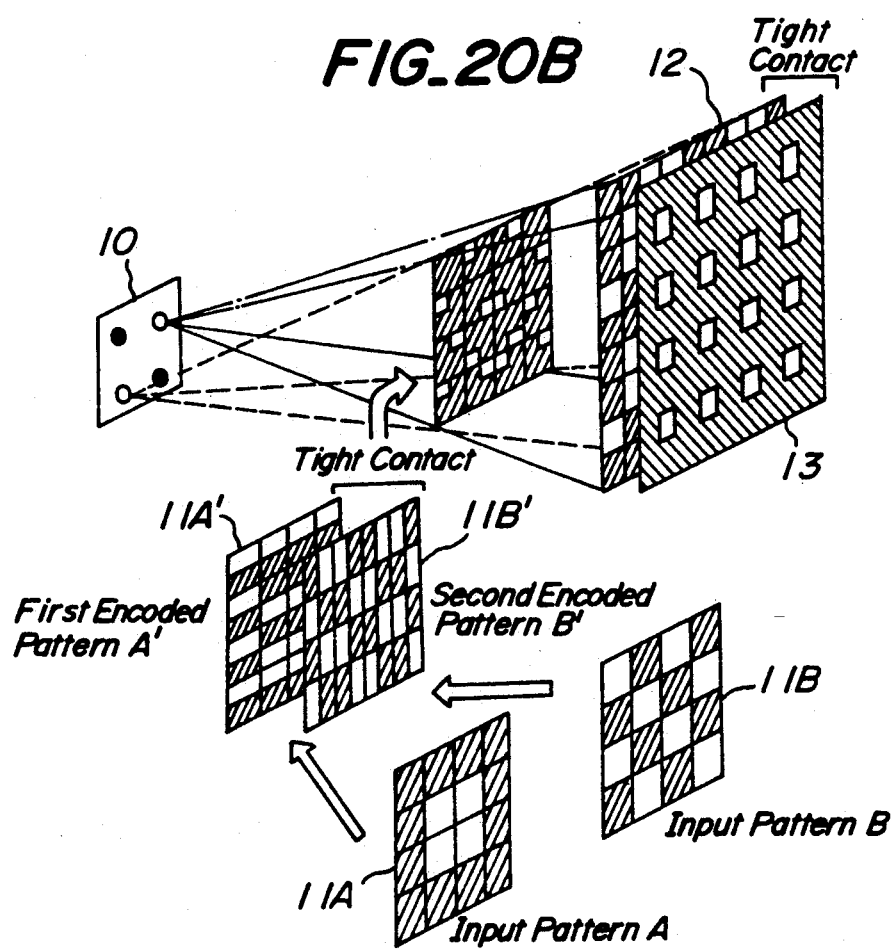

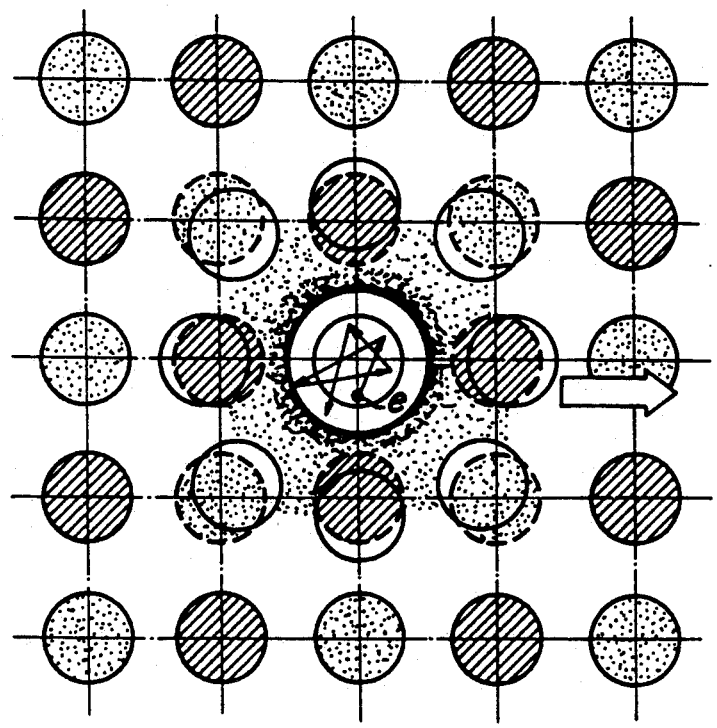
FIG_21A

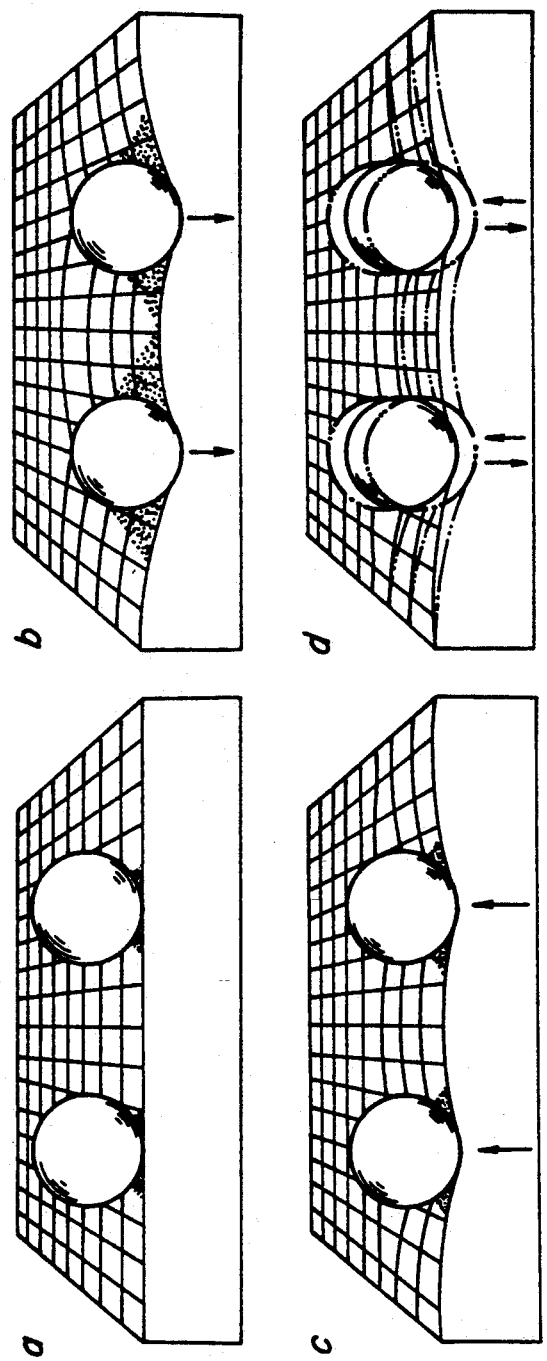
FIG._21B

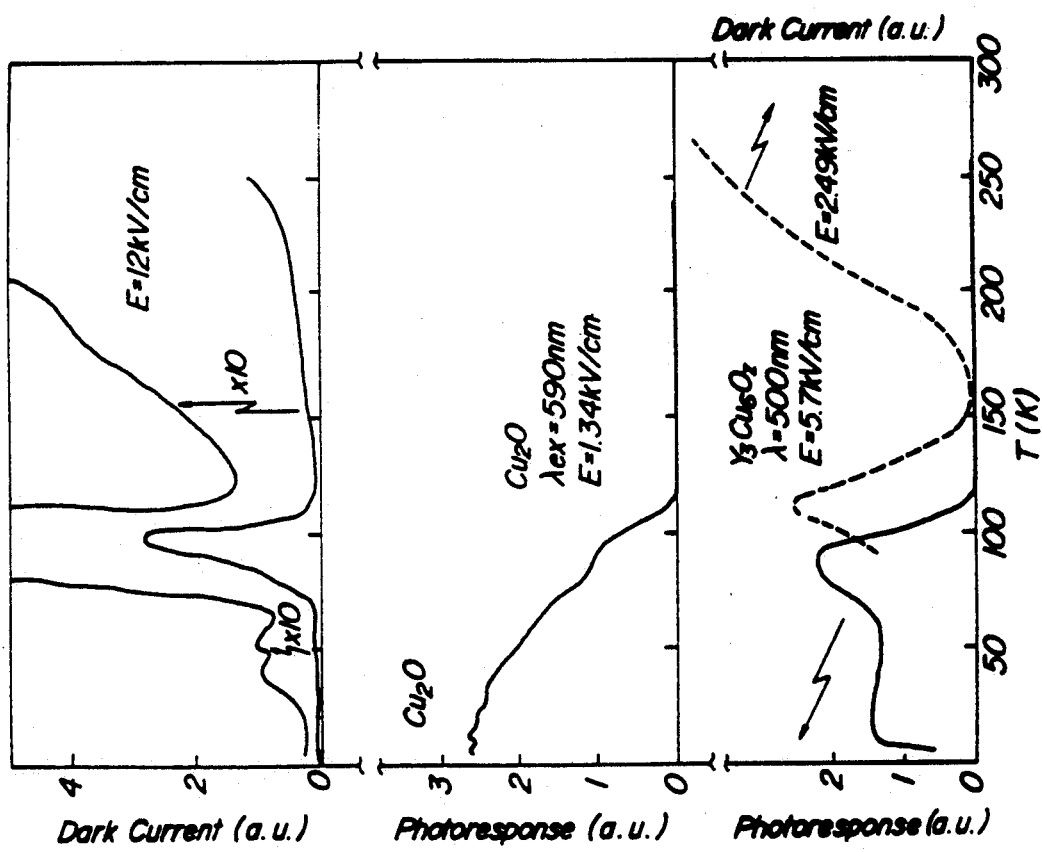
FIG._24A  FIG._24B  FIG._24C

FIG_25A
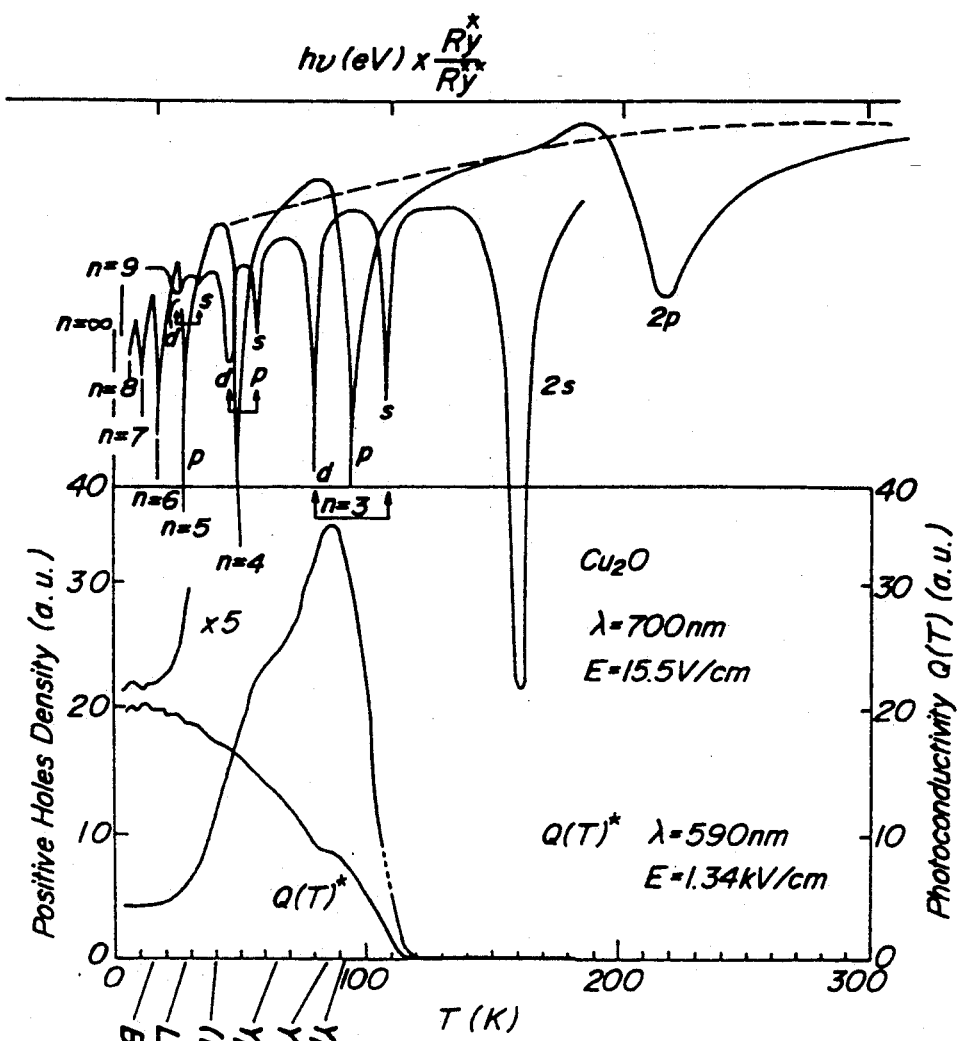
FIG_25B
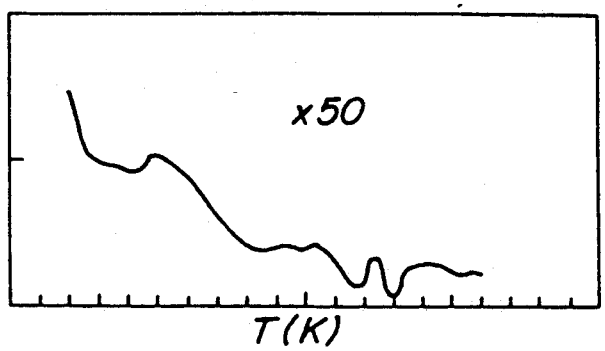

SUPERCONDUCTIVE OPTOELECTRONIC DEVICE WITH THE BASIC SUBSTANCE CU₂O OF SUPERCONDUCTIVE-CONJUGATE PHOTOCONDUCTIVITY

BACKGROUND OF THE INVENTION

1. Field of the Invention

This invention relates to a superconductive optoelectronic device and a superconductive optoelectronic apparatus with a basic substance $Cu_2O$ of superconductive-conjugate photoconductivity. The superconductive optoelectronic device of the present invention is novel and vastly different from those of prior art in that the invention uses a combination of the Cu-based superconductive oxide material and the basic material $Cu_2O$ of special superconductive-conjugate photoconductive character which reveals photoconductivity below the critical temperatures of the Cu-based superconductive materials relevant to the basic substance $Cu_2O$.

The invention also relates to a superconductive optoelectronic apparatus with $Cu_2O$ having a plurality with diversity of the superconductive optoelectronic devices produced therein in the form of integrated circuit ultra high density, e.g. in two dimensional array form.

The invention stems from the inventor's important discovery of a phenomenon that a certain basic substance reveals photoconductivity at temperatures below the critical temperatures of superconductivity $T_{sc}$ of relevant superconductors, and such photoconductivity of that basic substance is in a conjugate relationship with the superconductivity of the relevant superconductors.

In the ensuing description, the "basic substance" refers to the substance with the abovementioned character, or that substance which reveals the superconductive-conjugate photoconductivity to be defined below. The basic substance to be used in the present invention is cuprous oxide $Cu_2O$ and the relevant superconductors are the Cu-based oxides.

Here, I define "Superconductive-Conjugate Photoconductivity" to be a photoconductive response exhibited in basic substances or host insulators which emerges in several steps with decreasing temperature in accordance or in correspondence with the critical temperatures of superconductivity in relevant conductive substances, all based on the discoveries and inventions disclosed by the present inventor in that "Photoconductivity" and "Super-conductivity" are conjugate with each other in a certain group of systems such as in $Cu_2O$ and the Cu-based oxide superconductors.

2. Related Art Statement

With recent development of superconductive materials, various new superconductive substances have been found; for instance, superconductive oxide materials such as those of Y-Ba-Cu-O system and Bi-Sr-Ca-Cu-O system. However, most of current research efforts are focused on the raising of transition temperature or critical current, and not thorough studies except those on the reflection or scattering have been made on either optical properties of superconductive substance or industrial applications of such optical properties. The reason for it is that, generally speaking, researchers have considered that superconductivity is incompatible with such physical properties as optical absorption and photoconductivity and they have assumed that optical irradiation in the region of an excess amount of energy with the relevant wave number beyond the energy gap of the BCS theory will merely destroy the stability of superconductivity. Further, most of the superconductive materials which have been developed so far are metals or alloys or at least metallic materials, and no superconductive materials with useful optical properties have been found. No concept had existed, until the present inventor disclosed for the first time, on a new field to be called "Superconductive Optoelectronics".

On the other hand, if a high-temperature superconductive oxide material is combined with a recently recognized basic material such as $Cu_2O$ of superconductive conjugate photoconductivity which reveals its proper photoconductivity at temperatures below the transition temperatures of the relevant Cu-based superconductive oxide materials, a number of new and more efficient electronic devices and optoelectronic apparatuses may be developed, for instance, a switching device with theoretically no power loss, an optically operating device with theoretically no power loss, an optically operating logical device, a space parallel type optically operating apparatus, a camera or an image forming device possibly with superconducting wiring, a high-speed optically operating apparatus to be driven at an extremely low power, and the like.

SUMMARY OF THE INVENTION

Although most researchers currently aim at the raising of transition temperatures of superconductive materials, the inventor has thoroughly performed a number of experiments and analyses on optical properties of superconductive oxide materials, such as those of the Y-Ba-Cu-O system, La-Cu-O system, Bi-Sr-Ca-Cu-O system, Ba-Pb-Bi-O system and eventually a basic substance such as $Cu_2O$. Consequently, the inventor has discovered an entirely new and remarkable phenomenon in that a few of the basic oxide substances are superconductive-conjugate photoconductive-materials to be defined as those which reveal onsets and steps of photoconductivity at temperatures in accordance or correspondence with the critical temperature for superconductivity (transition point) of all relevant superconductive materials which are related to the superconductive-conjugate photoconductive-materials. The basic substances of superconductive-conjugate photoconductive-oxide materials are so far electric insulators or semiconductors at room temperature, but when they are cooled down to the temperatures below the transition points of the relevant superconductive materials, they reveal photoconductivity, i.e., they enhance life time of photocarriers to be observable and their conductivity varies depending on the intensity of the excitation light which is incident thereto.

A power-loss-free useful superconductive optoelectronic device can be formed by combining a basic substance e.g., $Cu_2O$, of superconductive-conjugate photoconductive material with its related Cu-based superconductive oxide material of for instance the Y-Ba-Cu-O system. What is meant by "superconductive optoelectronic device with basic substance" is an optoelectronic device made of a combination of a superconductive material of one oxide system and a basic substance of superconductive-conjugate photoconductive characters which reveals photoconductivity at temperatures below the critical temperatures of the relevant superconductive material.

An object of the invention is to provide a novel superconductive optoelectronic device by using effectively the optical properties of a basic substance such as $Cu_2O$ of the superconductive-conjugate photoconductive characters newly discovered by the inventor for the Cu-based oxide superconductors. Thus, the invention is neither a mere improvement of the prior art nor a simple solution of problems existing in the prior art, but is to be recognized a breakthrough beyond the framework of known technology.

A superconductive optoelectronic device according to the present invention, for instance, comprises a substrate, a photoconductive gate region formed on the substrate, and a source region and a drain region formed on the substrate at opposite sides of the gate region respectively so as to face toward each other across the gate region. The source and drain-regions comprise a superconductive material, while the gate region is consisted of a basic substance of superconductive-conjugate photoconductive materials which reveals photoconductivity at a temperatures below the critical temperature for superconductivity of the relevant superconductive materials. The basic substance of the superconductive-conjugate photoconductive material and the superconductive material are of common origin but with additions of constituent elements.

Bias source may be connected across the source region and the drain region of the optoelectronic devices of the invention, so as to drive an electric current through its photoconductive gate region controllable depending on the intensity of light which is incident to the photoconductive gate region.

Once such a type of superconductive optoelectronic device is formed with a basic substance $Cu_2O$, it must be naturally straight forward to develop the new field from such a device to other devices, and eventually to superconductive optoelectronic apparatus with a basic substance $Cu_2O$, for instance a switching device with no power loss, an optically operating device with no power loss, an optically operating logical device, a space parallel type optically operating device, a camera or an image forming device possibly with superconducting wiring, a high-speed optically operating apparatus to be driven at an extremely low power with higher optical efficiency, and the like.

BRIEF DESCRIPTION OF THE DRAWINGS

For a better understanding of the invention, reference is made to the accompanying drawings, in which:

FIG. 1 schematically displays a few intercorrelations between a basic substance or host insulators and a series of high-$T_c$ superconductors;

FIG. 2A illustrates a typical graph of the temperature dependence of photoconductivity $Q(T,\lambda)$ of $Cu_2O$ single crystal at $\lambda = 590$ nm and $E = 1.34$ kV/cm together with an example of normal photoconductivity, e.g., AgCl;

FIG. 2B is a graph of the temperature dependences of transient photoconductivity $Q(T,\lambda)$ of the $Y_{3-x}Ba_x$-$Cu_3$-$O_z$ system;

FIG. 2C is a graph of the temperature dependence of resistance (R) of the $Y_{3-x}$-$Ba_x$-$Cu_3$-$O_z$ system;

FIG. 4A indicates the wavelength dependence of the absorption constant $\kappa(\lambda)$ of $Cu_2O$ at $T=4.2$ K (after Grosmann);

FIG. 4B indicates the wavelength dependence of the superconductive-conjugate photoconductiivy $Q(t, \lambda)$ of the $Y_{3-x}$-$Ba_x$-$Cu_2$-$O_z$ system for $x=0$;

FIG. 4C indicates the wavelength dependence of the superconductive-conjugate photoconductivity $Q(T,\lambda)$ of the $Y_{3-x}$-$Ba_x$-$Cu_2$-$O_z$ system for $x=1$;

FIG. 5 is a schematic illustration of the valence bands and conduction bands of $Cu_2O$ near the zone center together with three wavelengths of photoexcitations at $\lambda 571$ nm, 610 nm, 690–710 nm indicated;

FIG. 6A illustrates a technique for detecting the transient photoconductivity signal $Q(T,\lambda)$ in an insulator, where the insulator is arranged between the blocking electrodes;

FIG. 6B illustrates a technique for detecting the transient photoconductivity signal $Q(T,\lambda)$ in an insulator, where the blocking electrodes are arranged on the same side of the insulator.

FIG. 7 is a block diagram of a typical circuit arrangement for the transient photoconductivity measurement for insulators;

FIG. 8B is a diagram of said temperature dependence of FIG. 8A displayed in the scale magnified by a factor of $10^2$;

FIG. 10A indicates the temperature dependence of the density of positive holes in $Cu_2O$ at low electric field $E_x$, magnetic field $H_z$ and excitation wavelength $\lambda = 700$ nm and $T=4.2$–300 K;

FIG. 10B is a part of graph showing FIG. 10A at the scale magnified by a factor of 50;

FIG. 11A shows (a) photocarriers density $n(T,\lambda)$, (b) relative ratio $n(T,\lambda)/I_{ex}$, and (c) the relative decrement of photocarrier density $\Delta n/I_{ex}$, at $T=5.0$ K all as a function of excitation intensity $I_{ex}$;

FIG. 11B shows relative photoconductive signals $Qx/I_{ex}$ at $T=80$ K as a function of $I_{ex}$;

FIG. 12 is a block diagram of the experimental apparatus for the time-resolved cyclotron resonance absorption of photocarriers in insulators in the n-sec region;

FIG. 14A illustrates typical traces of microwave pulse photosignals $Q\omega(T,\lambda,E\omega,H;t)$ at $T=77$ K and $\lambda = 487$ nm;

FIG. 14B illustrates typical traces of microwave pulse photosignals $Q\omega(T,\lambda,E\omega,H;t)$ at $T=77$ K and 585 nm;

FIG. 15A illustrates typical recorder traces $Q\omega(T,\lambda, E\omega,H;t)$ of the cyclotron resonance absorption lines due to photocarriers in $Cu_2O$ at $T=4.2$ K and $\lambda = 610$ nm;

FIG. 15B illustrates typical recorder traces $Q\omega(T,\lambda, E\omega,H;t)$ of the cyclotron resonance absorption lines due to photocarriers in $Cu_2O$ at $T=4.2$ K and $\lambda = 630$ nm;

FIG. 15C illustrates typical recorder traces $Q\omega(T, \lambda,E\omega,H;t)$ of the cyclotron resonance absorption lines due to photocarriers in $Cu_2O$ at T=4.2 K and $\lambda$=690 nm;

FIG. 16A illustrates typical recorder traces of cyclotron resonance of holes and electrons in $Cu_2O$ at f=35 GHz, T=4.2 K for various excitation intensities $P_{ex}$ of $\lambda$=583 nm;

FIG. 16B illustrates typical recorder traces of cyclotron resonance of holes and electrons in $Cu_2O$ at f=35 Ghz, T=4.2 K for various excitation intensities $P_{ex}$ of $\lambda$=735 nm;

FIG. 17 indicates a schematic energy levels of several electronic states in $Cu_2O$ with indicated values of $\lambda_{ex}$;

FIG. 18 is a schematic sectional view of a superconductive optoelectronic device according to the invention;

FIG. 19 is a schematic partial sectional view of a superconductive optoelectronic array device according to the invention;

FIG. 20A is a diagrammatic illustration of a space parallel optically operating superconductive optoelectronic apparatus which uses arrays of the superconductive optoelectronic devices of the invention as a method of encoding an input signal;

FIG. 20B is a diagrammatic illustration of a space parallel optically operating superconductive optoelectronic apparatus which uses arrays of the superconductive optoelectronic devices of the invention in a mode of projection by LED array for operation;

FIG. 21A illustrates the concepts of a "polaron", i.e., a conduction electron or a positive hole associated with LO-phonons or deformation of host crystal lattice together in free motion;

FIG. 21B illustrates the concept of a "bipolaron" mediated via a coherent ensemble of phonons, lattice deformation or even electronic polarization;

FIG. 24A displays the temperature dependence of the dark polarization current $\kappa(T,\omega)$ of $Cu_2O$ at $\omega \sim$ 150 Hz;

FIG. 24B displays the temperature dependence of the transient photoconductivity $Q(T,\lambda)$ at $\lambda$=590 nm of $Cu_2O$ in relationship to the dark polarization current of FIG. 24A;

FIG. 24C displays similar data for $Y_3Cu_6O_z$; and

FIG. 25A provides a basis for recognition of a series of "Clew temperatures $T_{pc}$ or Step temperatures $T_{ps}$" in $n_p(T)$ of $Cu_2O$ at $\lambda$=700 nm and in Q(T) of $Cu_2O$ at $\lambda$=590 nm, respectively, and enumerating several values of the critical temperatures of the Cu-based high-$T_c$ superconductive oxides below the abscissa;

FIG. 25B shows the ordinate $n_p(T)$ of FIG. 25A expanded 50 times.

Figure 3:
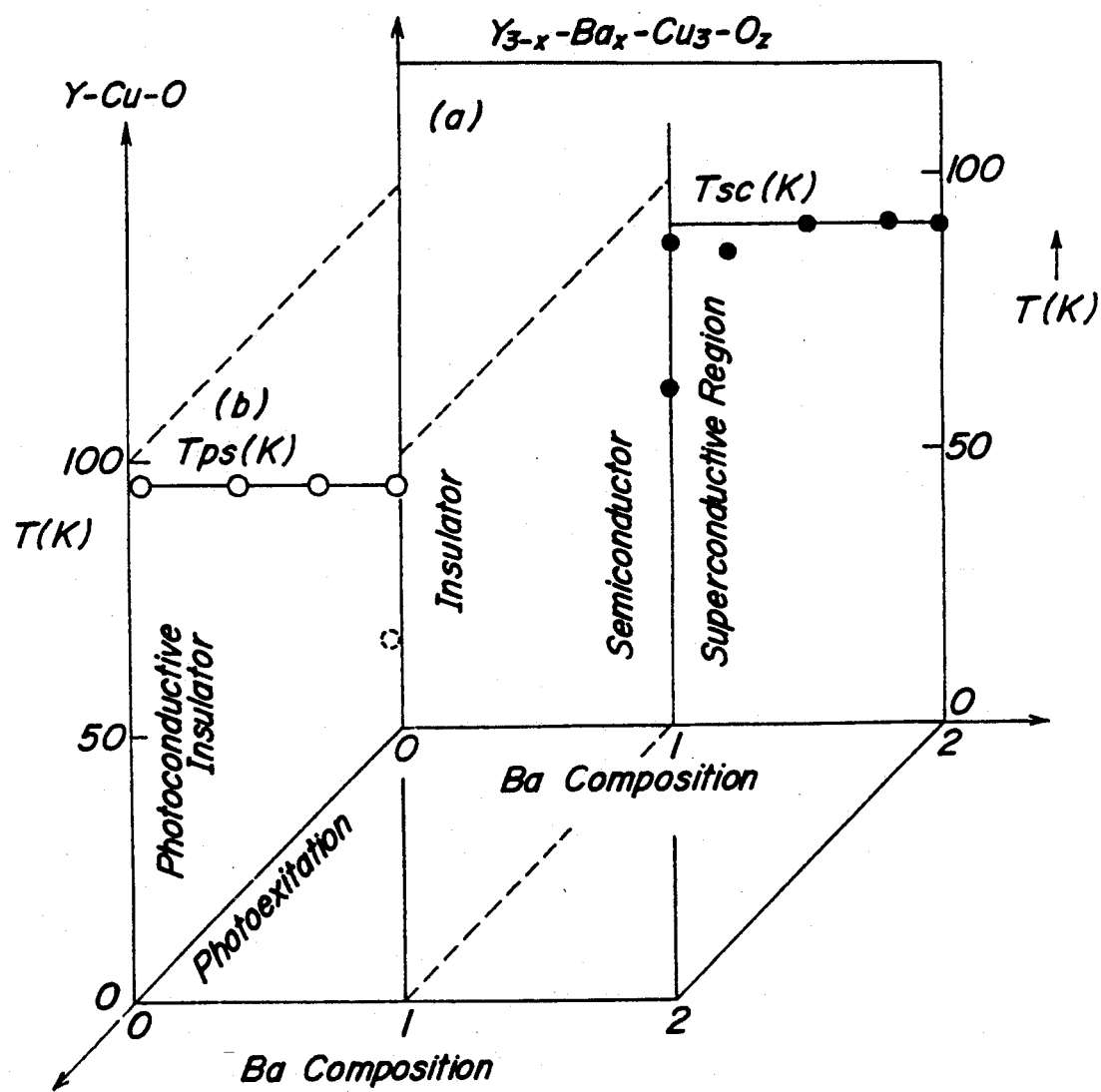
FIG. 3 indicates the phase diagram of the $Y_{3-x}$-$Ba_x$-$Cu_3$-$O_z$ system in thermal equilibrium in the dark and also a quasi-phase diagram at photoexcitation.

Throughout different views of the drawing in FIGS. 18-20, 1 is a substrate, 2 is a channel region for light modulated current conduction, hereinafter "photoconductive gate region or gate regions", 3 is a source region, 4 is a drain region, 5 is an insulating layer, 6 is a conductive glass layer, 7 is a common substrate, 10 is an array-like light source, 11 is an encoded image-mask pattern, 12 is a correlative image screen, and 13 is a decoding mask optical element array.

DETAILED EXPLANATION OF THE PREFERRED EMBODIMENTS

As described in the above, the present invention for a superconductive optoelectronic device uses a particular combination of the basic material $Cu_2O$, a host insulator, of superconductive-conjugate photoconductive character and the relevant Cu-based superconductive oxide materials as schematically enumerated in FIG. 1 into a form of a device in FIG. 18. There is a real peculiarity in such a combination.

The inventor has found that all these systems of high $T_c$ superconductors have their origins in the basic substances. For example, the $Y_3$-$Cu_3$-$O_z$ and $Y_3Cu_6O_z$ specimens can be synthesized by sintering $Y_2O_3$ powder with CuO or even $Cu_2O$ powders at appropriate sintering temperatures. By systematically varying the Ba-content in the $Y_{3-x}$-$Ba_x$-$Cu_3$-$O_z$, I have also examined and confirmed the existence of photoconductivity closely correlated with superconductivity complementary with each other, which I call "superconductive-conjugate photoconductivity". I have observed even a close correlation of superconductive-conjugate photoconductivity of the $Y_{3-x}$-$Ba_x$-$Cu_3$-$O_z$ with that of $Cu_2O$, the basic substance for all of the Cu-based superconductive oxides as illustrated in FIG. 2A through FIG. 2C. The knee or step temperatures $T_{ps}$ after their onsets in Q(T) are plotted in FIG. 3 in accordance or correspondences with the critical temperatures $T_{sc}$ in the dark resistivity $\rho(T)$ as a function of Ba-composition x.

One can readily recognize substantial roles of the basic substance $Cu_2O$ of superconductive-conjugate photoconductivity in FIGS. 1 and 2.

FIG. 4A illustrates the optical absorption $\kappa(\lambda)$ of $Cu_2O$ in FIG. 2A. FIG. 4B and FIG. 4C illustrate the wavelength dependence of the photoresponse $Q(T,\lambda)$ of $Y_3$-$Ba_x$-$Cu_3$-$O_z$ system superconductive photoconductive substances for x=0 and x=1 respectively. Origins of "the superconductive-conjugate photoconductivity" and of "real superconductivity" can be inherently of common characters over the whole regions of x.

Thus, such a combination does have a profound significance as will be discussed later. Technically, $Cu_2O$ or CuO can be a flux for producing the Cu-based high-$T_c$ superconductors. This fact guarantees an appropriateness of $Cu_2O$ for materials of the gate region of a superconductive optoelectronic device in the present invention.

Accordingly, I have reexamined yet unexplored natures of these basic substance such as $Cu_2O$ for the superconductive optoelectronic device and discovered substantially new nature of the photoconductive material conjugate with superconductivity.

Here, I describe further details of the information of $Cu_2O$ below.

(1) Photoconductivity of $Cu_2O$;

Cuprous oxide is a classic semiconductor of the p-type. Optical, electrical and vibrational properties of this material have been well studied over half a century. Still, the intrinsic mechanisms of electrical conduction in $Cu_2O$, such as scattering mechanisms, have not been sufficiently clarified yet. No one has paid special attentions to the novel temperature dependence of photoconductivity $Q(T,\lambda)$ of $Cu_2O$.

Cuprous oxide has six atoms in its unit cell and is known to have two modes of LO phonons with frequencies at 153 cm$^{-1}$ and 660 cm$^{-1}$, respectively, both at 4.2 K. It has been considered in prior studies of hole mobilities that for a temperature range from 200 K to 300 K the predominant scatterers are the high-frequency LO phonons. However, the analyses of polar optical phonon scattering by prior investigators were all based on theories devised for diatomic crystals; thus the resultant conclusions are not at all satisfactory. In particular, the effect of the low-frequency LO phonons has not been studied properly. Conventional studies have been limited to temperatures above that of liquid nitrogen, i.e., 77 K or 100 K, due to high resistivity or insulating properties of such substance at lower temperatures. The lack of knowledge at low temperatures caused ambiguity in the identification of scattering mechanisms.

The inventor has newly studied the experimental results of the measurements of photoconductivity Q(T), and the Hall mobility $\mu$H(T) of photoexcited positive holes in the $\Gamma_7+$ valence band (heavy holes) and conduction electrons in the $\Gamma_1+$ band of polycrystalline $Cu_2O$ in the temperature range from 4.2 K to 300 K as shown in FIG. 2A, FIGS. 8A, 8B and FIG. 9. Dominant carriers are positive holes. The analysis of LO-phonon scattering has been performed according to the theory of carrier-lattice interactions in polyatomic crystals. The intrinsic scattering mechanisms of positive holes in $Cu_2O$ have been clarified, for the first time, in a wider temperature range from 4.2 K up to 400 K.

Polycrystalline cuprous oxides were prepared by the conventional method. High-purity copper platelets were oxidized at 1030° C., annealed at 1130° C. and slowly cooled, all in the air. Specimens of about 5(mm)×5(mm)×0.5(mm) were fabricated and polished both mechanically and chemically.

A large number of data have been accumulated on the absorption spectrum of $Cu_2O$ in full detail as exemplified in FIG. 4A and a schematic illustration of the energy levels is displayed in FIG. 5. The absorption edge, called the red edge, is associated with the indirect transition of electrons to the 1s-band of the yellow exciton. [M. Grosmann: "Polaron and Excitons, edited by C. G. Kuper and G. D. Whitfield (Plenum Pres New York, 1963) p.373.] It is also well known that this material has several local energy levels in its forbidden band which are associated with the non-stoichiometry as schematically depicted in FIG. 5. When the crystal is excited with a light at a wavelength longer than that of the red edge, valence electrons are excited to the local levels and positive holes are created mostly in the $\Gamma_7+$ valence band. The overall electronic configuration of the valence band with the $\Gamma_8+$ band consists of Cu(3d)$^9$ after photoexcitation. Because the absorption constants in these regions of wavelength are very small, positive holes are uniformly excited in the crystal.

At low temperatures, e.g., below 77 K, the resistivity of $Cu_2O$ becomes very large. At these temperatures the standard methods using contact electrodes, which are widely used in the measurements of galvanomagnetic phenomena in most semiconductors, encounter difficulties such as low S/N ratios and non-Ohmic properties of electrodes. Thus, in measuring the Hall mobilities, I adopted the transient pulse technique of photoconductivity measurements with blocking electrodes which had been developed in the investigations of polaron kinetics in ionic crystals. The electrodes used here ar of the type arranged in the observations of hot electron galvanomagnetic phenomena in polar semiconductors, as shown in FIGS. 6A, 6B and with a typical circuit arrangement in FIG. 7.

As a light source, a dye laser with a pulse width of about 5 nsec, excited by a nitrogen pulse laser, was used at the wavelength of excitation light $\lambda=480-735$ nm. The polarity of the observed Hall signal at $\lambda_{ex}=700$ nm and low power levels of excitations was found to be definitely that of positive holes. Density of the excited free holes was of the order of $10^9$ cm$^{-1}$. Temperatures, T, were monitored with the standard Au+0.70% Fe-Chromel thermocouple fixed in the sample holder. Because the mobilities of positive holes at low temperatures becomes sufficiently large special attention was paid in setting applied electric fields so that the drift velocity of holes might not exceed the velocity of sound in this substance. Magnetic fields were applied by using a superconducting magnet. Space charge depolarization light of the wavelength longer than 800 nm was additionally superposed.

Figure 8A:
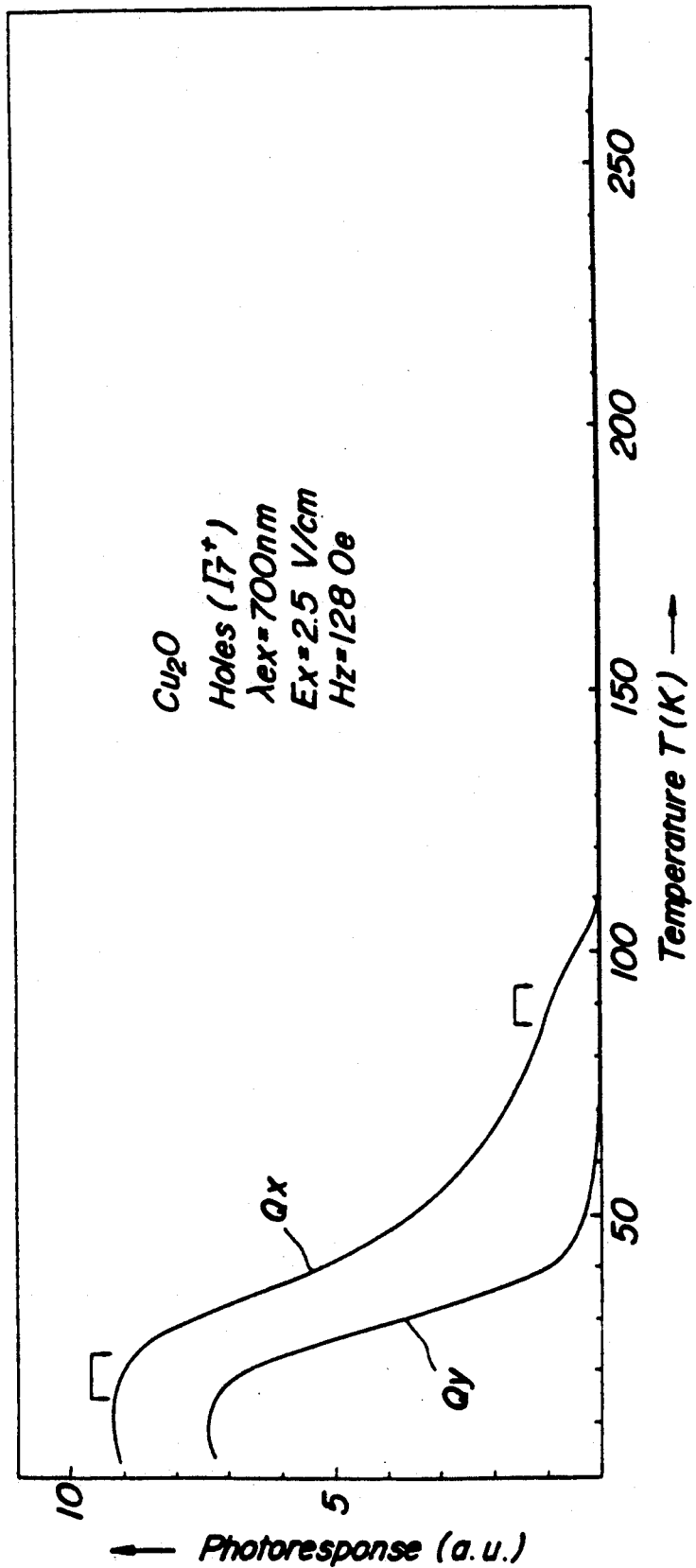
FIG. 8A illustrates the temperature dependences of the transient photoconductivity $Q_x(T,E_x,H_z)$ and $Q_y(T,E_x,H_z)$ of $Cu_2O$ at the crossed low electric field $E_x$, magnetic field $H_z$ under the light excitation at wavelength $\lambda = 700$ nm.

FIG. 8 illustrates typical traces of temperature dependence of photosignals Q(T,E,H) of $Cu_2O$ at crossed low electric and magnetic fields, E and H, respectively. The symbol $Q_x$ represents the photocurrent signal in the direction of the electric field, and $Q_y$ represents the Hall current signal in the direction perpendicular to both fields, both time-integrated. Above 110 K, $Q_x$ rapidly diminishes with a trace as displayed in FIGS. 8A and 8B. As described in the previous section, the polarity of $Q_y$ is that of positive holes. One readily notices that, as temperature rises, $Q_y$ falls more steeply than $Q_x$. Since in a transient measurement the Hall mobility, $\mu_H$, is calculated in terms of the ratio $Q_y/Q_x$, this suggests a rapid decrease of the hole mobility.

Figure 9:
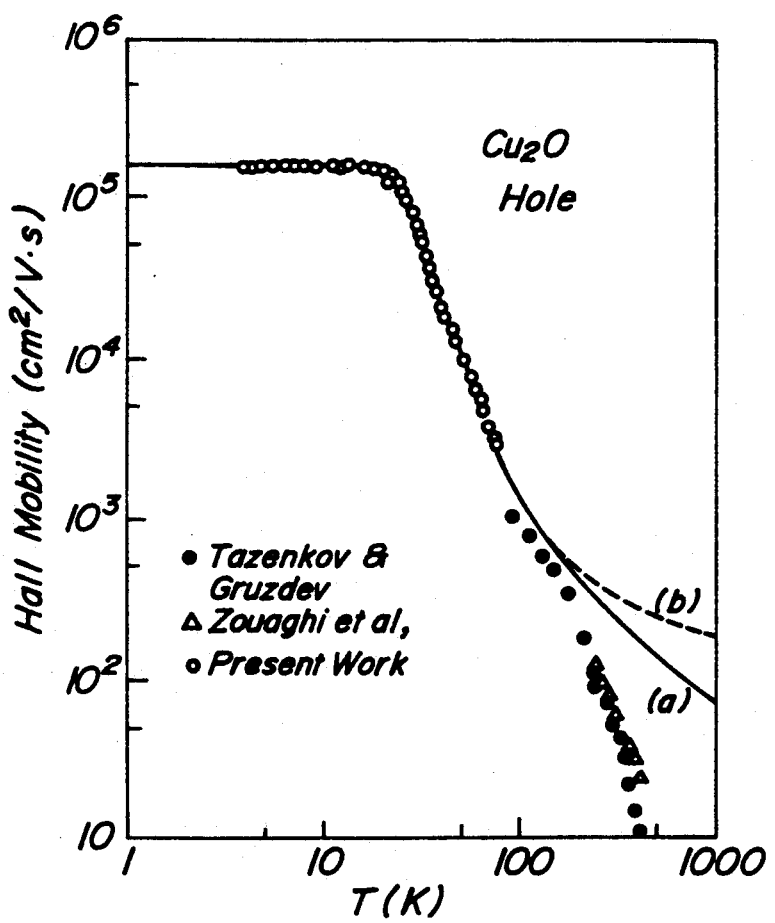
FIG. 9 is a graph of the Hall mobility $\mu_H(T)$ of positive holes in $Cu_2O$ versus the temperature both in the logarithmic scales, together with the data taken from Tazenkov and Gruzdev and also Zouaghi et al. The graph includes two theoretical curves, i.e., (a) $\mu_H$ due to scattering by both low and high frequencies of LO-phonons, and (b) $\mu_H$ due to the effect of the low-frequency LO phonon only.

Results of the calculated Hall mobilities based on the data in FIG. 8 are plotted in FIG. 9. The highest value of the residual mobilities of positive holes obtained at the lowest temperatures is as high as 160,000 cm$^2$/V.sec. This is surprisingly high if one recalls the density of imperfection of the order of $10^{18/3}$.

General features of the temperature dependence of mobilities can be analyzed qualitatively in comparison with the standard theory. Below 20 K, the observed mobilities are almost independent of temperature as shown in FIG. 9; this indicates that at these temperatures, the neutral impurity scattering is dominant. Above 40 K, one clearly recognizes a nearly exponential dependence of the Hall mobility $\mu_H$ on 1/T, which subtests predominanee of polar optical scattering. Here the slope is rather moderate and the contribution of phonons of relatively small energy is revealed.

Intrinsic scattering mechanisms of positive holes in the $\Gamma_7+$ valence band of $Cu_2O$ have been investigated in a wide temperature range of from 4.2 K to 400 K. Particularly, the effect of the two modes of LO-phonons (soft phonons with low frequency 153 cm$^{-1}$ and hard phonons with high frequency 638 cm.$^{-1}$) has been clarified, for the first time, in comparison with the theory of carrier-lattice interactions in "polyatomic" crystals. In the temperature range from 40 K to 100 K, the effect of the low-frequency LO-phonon is predominant. Above 100 K, the effect of the high-frequency LO-phonon becomes remarkable. Also the mobility-quenching effect due to the metastable self-trapped states possibly exists in this material above 200 K. Below 40 K, the scattering is due to a combination of the effects of the low-frequency LO-phonon, acoustical LA-phonon and neutral impurity. The last process due to impurity appears to be dominant below 20 K. The deformation potential constant of the $\Gamma_{7+}$ valence band is estimated to be $0.7\pm0.3$ eV. (2) Photoconductivity of the $Y_{3-x}$-$Ba_x$-$Cu_3$-$O_z$ systems;

This gives an experimental foundation of the concept of the basic substance $Cu_2O$ of superconductive-conjugate photoconductivity for the relevant superconductors Y-Ba-Cu-O system. A series of systematic studies of the novel spectral photoconductivity of the $Y_{3-x}Ba_x$-$Cu_3O_z$ system conjugate with superconductivity have been performed and compared with the data of the basic characters of $Cu_2O$ as already exemplified in FIGS. 2A and 2B, and FIGS. 4A~4C. By varying the Ba-content of the $Y_{3-x}$-$Ba_x$-$Cu_3$-$O_z$ system, I have confirmed for the first time that the system between $x=0-1$ can be specified to be a photoconductive insulator or a semiconductor associated with superconductors via accordance of onset temperatures to be called "a superconductive-conjugate photoconductive-substance" even in the region continuously close to the superconductive region ($x=1-2$). "Superconductive-conjugate photoconductivity" is clearly distinguishable in contrast to the normal photoconductivity which decreases rapidly as temperature decreases. I also propose a potential existence of the $Cu_2O$-like part in the Y-Cu-O, Y-Ba-Cu-O and La-Cu-O systems which reveals an importance of the conversion of $Cu^{+1}$ to $Cu^{+2}$ ions at photoexcitations regardless of the difference of crystal structures among various compositions and systems. It is not a matter of primary importance to ask whether they are of single phase or of multi-phases. Here, in FIGS. 2A-2C I display an assembly of experimental results of further systematic study of novel spectral photoconductivity of the $Y_{3-x}$-$Ba_x$-$Cu_3$-$O_z$ system in order to exemplify a conjugation between $Q(T)$ and $\rho(T)$. The origin of conjugate-photoconductivity associated with superconductivity and of real superconductivity may be inherently of common characters over the whole system and complementary with each other.

Specimens of the Y-Cu-O, Y-Ba-Cu-O system were prepared by the solid phase reaction of $Y_2O_3$, $BaCO_3$ and CuO powders with selecting appropriate compositions of $BaCO_3$. By an X-ray diffraction technique, the crystal structures of the $Y_{3-x}$-$Ba_x$-$Cu_3$-$O_z$ system had been well studied. As the reference material, I examined also polycrystalline specimens of $Cu_2O$ which were prepared by oxidizing high-purity copper platelet. Clearly, as the value of x varies, the crystal structures of $Y_{3-x}$-$Ba_x$-$Cu_3$-$O_z$ system also vary. Thus, they never belong to a single phase of crystal structure but are denoted by different space groups. Naturally, they are different from that of $Cu_2O$. This situation, however, is not a matter of primary importance in the subject. The crystal structures are of cours generally important to identify the materials and to control the values of $T_c$.

Of the $Y_{3-x}$-$Ba_x$-$Cu_3$-$O_z$ system for $x=0-0.7$ and $Cu_2O$, the electrical resistivity of specimens $\rho(T)$ in the dark at temperature, T(K), is usually extremely high, e.g., $\rho \leq 10^{8-10}$ $\Omega$cm below 250 K, and they are normally insulators. Thus, one can never apply the conventional four-probe technique to the $\rho(T)$ measurement of such insulating specimens. Instead, I have successfully applied the transient technique with blocking electrodes for the photoconductivity $Q(T,\lambda)$ measurement by using a dye laser with the pulse width of the order of 3 nsec at the excitation light wavelength $\lambda_{ex} \approx 400-700$ nm. Here, I observe the displacement current due to the mirror image of small free motion of photocarriers inside of tiny grains during their short life time. Photocarrier density was normally of the order of $10^{6-8}$ cm$^{-3}$ averaged over specimens, but can be of the order of $10^{12}$ cm$^{-3}$ at surface layer with large values of the absorption constant $\kappa(\lambda)$. This technique has been proved to be powerful even to study the transient photoconductivity of microcrystalline AgBr of the order of 1.3 $\mu$m-50 nm in size. As the value of x increases and approaches $x=1$, the conventional four-probe technique becomes applicable for $\rho(t)$ measurements.

Magnetic susceptibility $\chi(T,H)$ measurements were supplementary performed by using a microwave SQUID at 9 GHz to confirm the signs of the magnetization M(T,H).

FIG. 2A illustrates the temperature dependence of transient photoconductivity $Q(T,\lambda,E,H)$ of $Cu_2O$ as the basic material at weak electric and magnetic fields E and H and $\lambda=590$ nm, where optical absorption due to the interband- or even interband exciton-transition in $Cu_2O$ can be observable as indicated in FIG. 4A. Both the positive holes and electrons can be created by photoexcitation at the interband transition of $Cu_2O$. Hall signals indicate that the dominant photocarriers are definitely positive holes. One may notice that the photoconductivity $Q(T,\lambda)$ of $Cu_2O$ starts to emerge below $T=110$ K and has several knees or steps at between 90 K and 20 K as exemplified in FIG. 2A.

FIG. 2B, FIG. 4B, and FIG. 4C display a series of the temperature and excitation wavelength dependences of transient photoconductivity $Q(T,\lambda)$ of the $Y_{3-x}Ba_x$-$Cu_3$-$O_z$ system for $x=0$, 0.4, 0.7 and 1 together with the resistivity in the dark $\rho(T)$ for $x=1$ and 2. Remarkable features here are the accordances of the onsets temperatures of the photoconductivity $Q(T,\lambda)$ and/or of $\rho(T)$ for $x=0$ to 2 via $x=0.4$, $x=0.7$ and $x=1$ regardless of a clear difference in $Q(T,\lambda)$ spectra over $\lambda$ for $x=0$ and 1. This specimen exhibits a possible existence of mixed phases. The value of M(T,H) of #S21 is 1/30 of that of #S20. Main features here, however, remain universal. No photoconductive signals has been observable for the perfectly superconductive specimen ($x=2$). The accordance of the onset temperatures is by no means accidental, because a similar accordance can be observable also for the La-Cu-O system at $T=20$ K. Physically more significant may be the accordances between the knee or step temperatures $T_{ps}$ in $Q(T,\lambda)$ and the superconducting critical temperatures $T_{sc}$ in $\rho(T)$.

The magnetization M(T,H) of the $Y_3$-$Cu_3$-$O_z$ #S60 ($x=0$) is paramagnetic at $H=48$ Oe, whereas those of the $Y_2$-$Ba_1$-$Cu_3$-$O_z$ #S21 ($x=1$) and of $Y_1$-$Ba_2$-$Cu_3$-$O_z$ #S20 ($x=2$) at $H=0.32$ Oe are clearly of diamagnetism characteristic to the superconductive specimens.

In FIG. 3, the knee or step temperatures $T_{ps}$ for the onset of photoconductivity $Q(T,\lambda)$ and the critical temperatures Tsc for the onset of superconductivity as indicated by the dark resistivity $\rho(T)$ of the $Y_{3-x}$-$Ba_x$-$Cu_3$-$O_z$ system are displayed as a function of x (Barium content). The phase diagram in thermal equilibrium in the dark of FIG. 3 labeled (a) shows how the nature of the substance changes from insulator to semiconductor to superconductor as x increases. Particularly, the substance is a superconductor when x is form 1 to 2. The quasi-phase diagram at photoexcitation of FIG. 3 labeled (b) shows that the substance is a photoconductive insulator or a photoconductive semiconductor when x is from 0 to 1. These results reveal that origins of the photoconductivity associated with superconductivity and of real superconductivity may be of inherently common character over the whole system and complementary with each other. Thus, they are really conjugate.

(3) Details of photoconductivity Q(T) and photocarrier density $n_p(T)$ in $Cu_2O$;

Details of the temperature dependences of transient photoconductivity $Q(T,\lambda)$ and Hall mobility $\mu_H(T)$ of photoexcited carriers in $Cu_2O$ at low power levels of $\lambda_{ex}=700$ nm have been reexamined over a wide range between 4.2 K and 300 K in order to clarify the natures of "superconductive-conjugate photoconductivity". Photoexcitation at low levels of $\lambda_{ex}=700$ nm creates mainly positive holes in the $\Gamma_7+$-valence band of $Cu_2O$.

New parts of the data here consist of further analyzed but substantial results which are obtained by carefully reexamining and unifying the above-referred data of $Q_{xx}(T)$, $Q_{xy}(T)$ and $\mu_H(T)$ in FIGS. 2A, 8A, 8B and 9, so as to clarify the temperature dependence of density of photocarriers $n_p(T)$ on the basis of the following relations.

$$Q_{xx}(T) = \sigma(T)E = n_p(T)e\mu_d(T)E_x \quad (1)$$

$$Q_{xy}(T) = a(T)E_xH_z = n_p(T)e\mu_d(T)\mu H(T)E_xH_z/c, \quad (2)$$

where $\sigma$, $a$ are constants in the weak fields limit, and the Hall angle is given by $$\tan\theta(T) = Q_{xy}(T)/Q_{xx}(T) = \mu_H(T)H_z/c. \quad (3)$$

One readily finds the photocarrier density $n_p(T)$ via $$n_p(T) = Q_{xx}(T)/e\mu_d(T)E_x \quad (4)$$

as a function Of temperature. Hereafter, I abbreviate these symbols $Q_{xx}$ and $Q_{xy}$ simply by $Q_x$ and $Q_y$.

FIG. 5 displays a schematic energy diagram of the valence and conduction bands and the mid-gap localized states of $Cu_2O$ with the excitation wavelengths $\lambda_{ex}$ indicated.

FIG. 8A and FIG. 8B are newly supplemented traces of the data of the two components of transient photoconductivity $Q_x(T)$, $Q_y(T)$ at low power levels of $\lambda_{ex}=700$ nm and the resultant Hall mobility of photocreated positive holes $\mu_H(T)$ in $Cu_2O$. Specially added here are the data of $Q_x(T)$ at low power levels of $\lambda_{ex}=700$ nm above 110 K up to 300 K to be analyzed together with the data of $\mu_H(T)$ of holes in p-type $Cu_2O$ by Tazenkov and Gruzdev and Zouaghi et al in FIG. 9.

By using Eq.(4), I can immediately deduce the temperature dependence of density of photoexcited positive holes $n_p(T)$ as illustrated in FIG. 10, provided that the ratio $(\mu_H/\mu_d)$ remains nearly constant between $(3\pi/8)$ and 1. Here, I clearly recognize a series of fine structures in $n_p(T)$ in forms of "Clew Temperatures" in $n_p(T)$ of $Cu_2O$ at $\lambda=700$ nm or "Step Temperatures $T_{ps}$" in $Q(T)$ of $Cu_2O$ at $\lambda=590$ nm, which suggest a certain physical significance as will be discussed later. These series have been discovered for the first time by the present inventor.

In order to utilize the superconductive-conjugate photoconductive characters of $Cu_2O$ in a combination with the Cu-based high-$T_c$ superconductors, one must select the appropriate regions of excitation wavelength $\lambda$ and temperature T. Of the temperature region compatible with the Cu-based superconductors such as the Y-Ba-Cu-O and La-Cu-O system, an operating region below 90 K is preferable, whereas the wavelength region $\lambda=450$-620 nm is desirable. For example, $n(T,\lambda)$ or $Q(T,\lambda)$ are plotted as a function of the intensity of photoexcitation $I_{ex}$ at $\lambda=600$ nm and at $T=5.0$ and 80 K as illustrated in FIG. 11A and FIG. 11B. At 80 K, $(Q_x/I_{ex})$ is almost constant indicating a linearity. Thus, it is rather appropriate to utilize the basic substance of $Cu_2O$ of superconductive-conjugate photoconductivity in a combination with the Y-Ba-Cu-O system for a superconductive optoelectronic device.

Figure 13:
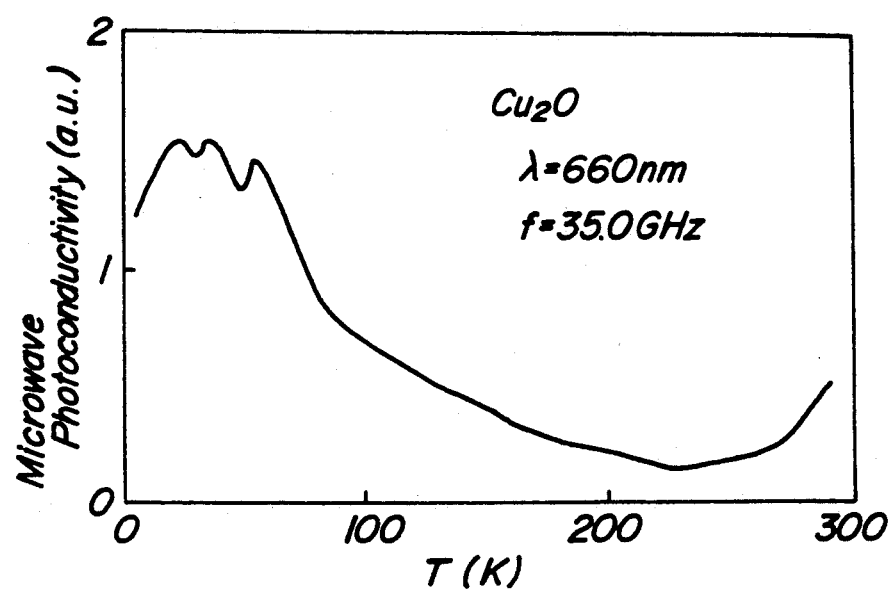
FIG. 13 indicates the temperature dependence of microwave photosignals $Q\omega(T,\lambda)$ of $Cu_2O$ at $f=35$ GHz and $=660$ nm.

(4) Cyclotron-resonance of photocarriers in $Cu_2O$;

For seeking high frequency response, I have also examined a pulsed photosignals $Q\omega(T,\lambda)$ of $Cu_2O$ by using a microwave spectrometer at $f=35$ GHz as indicated in FIG. 12. Temperature dependence of $Q\omega(T)$ at 35 GHz and $\lambda=660$ nm is shown in FIG. 13. Transient response of $Q\omega(T,\lambda,E\omega,H;t)$ at 77 K displayed in FIG. 14A and FIG. 14B is sufficiently fast to assure a high speed operation of the superconductive optoelectronic device in the n-sec region.

Specimens of $Cu_2O$ used here were primarily identical with the grain-growth single or polycrystals used in the previous subsection (1) and (3). They were grown by controlled oxidation of copper foil.

A standard reflection type of microwave spectrometer at 35 GHz was used with a non-resonant waveguide to detect photosignals of the time-resolved cyclotron resonance of electrons and positive holes in $Cu_2O$ especially via optically selected excitation by using a pulsed dye laser of 3-5 nsec wide at a repetition rate of 10-14 Hz as indicated in FIG. 12. Resolution of the excitation wavelength $\lambda_{ex}$ is of the order of $\Delta\lambda_{ex}=1$ nm.

An incident light flux is of the order of $10^9$-$10^{14}$ photons/pulse. All photosignals are normally detected in the synchronized mode by using a Boxcar integrator. Superconducting magnet supplies magnetic fields up to $H=10$ T which corresponds to $m=8.0$ ms at the operating frequency $f=35$ HGz. Optical selection of photocarriers were performed by setting $\lambda_{ex}=460$ (for the Indigo exciton series), $\lambda_{ex}=487$ (for the Blue exciton series), $\lambda_{ex}=546$ (for the Green exciton series), $\lambda_{ex}=579$ (for the interband excitation $E_Q$), $\lambda_{ex}=583$ (for the Yellow exciton series), $\lambda_{ex}=610$ (for the Red edge), $\lambda_{ex}=630$ and 690-700, 710, 730, 735 and 750 nm (for positive hole only excitation at the mid-gap region).

FIG. 13 illustrates a typical example of anomalous temperature dependence of microwave photosignals $Q\omega(T,\lambda,E\omega,H)$ with decreasing temperature T at zero magnetic field. Surprising phenomenon is a dramatic emergence of $Q\omega(T,\lambda)$ below 150 K for $\lambda_{ex}=660$ nm. At 300 K, one recognizes rather little photosignals. With decreasing temperatures, $Q\omega(T)$ vaguely appearing diminishes once, grows gradually below 150 K, steeply below 80 K and sustains with several structures down to 4.2 K. These structures correspond to those observed in transient photoconductivity experiments.

As displayed FIGS. 15A through 15C and FIG. 16A and FIG. 16B, by optically selective excitation at various values of $\lambda_{ex}$ especially below the band gap $E_G$ with high density, I have observed unusual behaviors of cyclotron resonance absorption spectra for $Cu_2O$. At $\lambda_{ex}=620$-630 nm, the peak height of resonance line only for positive holes increases sublinearly with $P_{ex}$. At $\lambda_{ex}=690$-700 nm with high density photon flux, there appears a new line due to conduction electrons together with the hole lines, which increases in proportion to $P_{ex}$ 1.2. But, even more surprisingly at $\lambda_{ex}=735$ nm, the resonance liens of both positive holes and electrons dramatically increases in proportion to $P_{ex}$ 2.0 as displayed in FIG. 16C. An unexpected emergence of such an additional resonance line due to electrons even at mid-gap excitation with high density photon flux is a remarkably nonlinear optical phenomenon in cyclotron resonance of holes and electrons in $Cu_2O$ at high density excitation.

FIG. 17 indicates a schematic energy levels of several electronic states in $Cu_2O$ with various values of $\lambda_{ex}$.

These results of the above study on microwave response of photocarriers in $Cu_2O$ guarantee a high speed and sensitive operation of the superconductive optoelectronic devices with the basic substance $Cu_2O$ in the n-sec region.

The inventor's experiments and analyses on the photoconductivity of the basic substances $Cu_2O$ and superconductivity of various relevant Cu-based superconductive oxide materials showed that the basic substance and a certain portion of superconductive materials in their phase diagram reveal photoconductivity conjugate with superconductivity at temperature below their regions of transition temperatures from normal conductivity to superconductivity. For instance, in the case of superconductive oxides of the Y-Ba-Cu-O system, the inventor discovered that with decreasing Ba content they exhibit the special feature as if their superconductivity can be converted into photoconductivity at temperatures below their critical temperatures.

FIGS. 2 illustrate typical results of experiments on the photoconductivity of the basic substance of $Cu_2O$ and the superconductivity of the Y-Ba-Cu-O system oxides. The curve (a) in FIG. 2 shows the temperature dependence of photoconductivity of $Cu_2O$ single crystal which is a basic substance clarified by the inventor. The curve (b) in FIG. 2 illustrates the temperature dependence of superconductive-conjugate photoresponse of Y-Cu-O or $Y_{3-x}$-$Ba_x$-$Cu_3$-$O_z$ (x=0). The curve (c) in FIG. 2 illustrates the temperature dependence of electric resistance of $Y_{3-x}$-$Ba_x$-$Cu_3$-$O_z$ (x=1 and 2) in the dark. After a number of experiments and analyses on $Cu_2O$ and the Y-Ba-Cu-O system oxides with a general chemical formula of $Y_{3-x}$-$Ba_x$-$Cu_3$-$O_z$, the inventor found that, the $Y_{3-x}$-$Ba_x$-$Cu_3$-$O_z$ system reveals superconductivity if, e.g., its content x of Ba is in the range of $1 \leq x \leq 2$, and if its content x of Ba is not more than 1, i.e., $0 \leq x < 1$ such superconductivity disappears and it reveals complementary photoconductivity at temperature regions below their transition temperatures. Those materials whose superconductivity is converted into complementary photoconductivity and vise versa depending on the concentration of a part of their ingredient Ba-atoms at temperature regions below their transition point temperatures will be referred to as "superconductive-conjugate photoconductive-materials" and their property will be referred to as "superconductive photoconductivity" herein. These are the case even for $Cu_2O$. Thus, one may call $Cu_2O$ the case basic substance of superconductive-conjugate photoconductivity for the Cu-base superconductive oxides.

Curves (a), (b) and (c) in FIG. 4 displays wavelength dependence of optical absorption of the basic substance $Cu_2O$ at T=4.2 K and photoresponse of the oxide specimen $Y_{3-x}$-$Ba_x$-$Cu_3$-$O_z$ (x=0) and (x=1) at T≈77 K, respectively. The basic substance $Cu_2O$ and the oxide $Y_{3-x}$-$Ba_x$-$Cu_3$-$O_z$ (x=0) have similar optical responses in wavelength dependences; more specifically, as the wavelength $\lambda$ decreases from 620~640 nm, their photoresponse $Q(T,\lambda)$ gradually increases, whereas their photoresponses remain substantially at low levels for wavelengths longer than 600 nm. The inventor noted that if the basic material $Cu_2O$ revealing photoconductivity at a temperature below its transition temperature of the Cu-based superconductors is combined with another material such as the Y-Ba-Cu-O, La-Cu-O systems revealing superconductivity at a temperature below its transition temperature, then such a combination will provide a useful superconductive optoelectronic device which reveals both superconductive and photoconductive characteristics at a temperature below the transition temperature thereof.

More specifically, if an optoelectronic element of FET-like shape is formed by making a gate region with the basic substance $Cu_2O$ of superconductive-conjugate photoconductivity while making a source region and a drain region with a relevant Cu-based superconductive oxide material, an output current whose magnitude varies depending on the wavelength and intensity of light incident to the gate region can be produced so as to flow across the source and drain regions. If such an optoelectronic device is sustained at a temperature below the transition temperature of its superconductive material, it must work as a superconductive optoelectronic device which can be used in numerous ways, for instance, as a power-loss-free optical switching device with high-speed response, an optical detector, an optical signals amplifying device, or the like.

Detailed experimental data indicated in FIG. 8 through FIG. 16 are of substantial importance in the aspect for application of $Cu_2O$ in superconductive optoelectronic device described above.

FIG. 11 shows the dependence of the photoconductivity of the basic substance $Cu_2O$ on the intensity of excitation light at a wavelength $\lambda$=600 nm. It may be concluded from FIGS. 11A and 11B that photoresponse signals $Q(T,\lambda)$ of the basic substance $Cu_2O$ for the oxide material of $Y_{3-x}$-$Ba_x$-$Cu_3$-$O_z$ system increases with the intensity of the excitation light. The inventor found that the basic substance $Cu_2O$, or the $Y_{3-x}$-$Ba_x$-$Cu_3$-$O_z$ system oxide becomes a superconductive-conjugate photoconductive-material, when its Ba concentration x is in a range $0 \leq x \leq 1$, while it becomes a superconductive material for $1 \leq x \leq 2$, all below 90 K.

EXAMPLES

FIG. 18 is a schematic sectional view of the structure of an embodiment of the superconductive optoelectronic device with a basic substance $Cu_2O$ of superconductive-conjugate photoconductivity according to the present invention. The embodiment is a superconductive phototransistor in which a positive gate voltage $V_G$ is used ($V_G$=0). A substrate 1 is made of $SrTiO_3$, and a photoconductive gate region 2 is formed on the substrate 1 with the superconductive-conjugate photoconductive-material $Cu_2O$. The photoconductivfe gate region 2 has a width of 0.2 $\mu$m to 1.0 mm and a thickness of 1–10 $\mu$m. The basic substance $Cu_2O$ of superconductive-conjugate photoconductivity reveals photoconductivity in response to excitation by incident light of wavelength at least $\lambda \approx$450–620 nm even at $\lambda$=735 nm at a temperature below the transition temperature of a superconductive oxide substance in the $Y_{3-x}$-$Ba_x$-$Cu_3$-$O_z$ system. At opposite portions over the gate region 2, a source region 3 and a drain region 4 are formed by using conjugative superconductor, such as the $Y_{3-x}$-$Ba_x$-$Cu_3$-$O_z$ oxide, which reveals superconductivity below its critical temperature $T_{sc}$, e.g., 60 K or 90 K. An electrically insulating layer 5 which is optically transparent is formed so as to cover top surface of the gate region 2, the source region 3, and the drain region 4. The insulating layer 5 of the illustrated example was a 1 $\mu$m thick $SiO_2$ film or mylar sheet. Further, a conductive surface of glass layer 6, for instance made of a NESA (Trademark of Pittsburgh Plate Glass Company) glass layer, is placed on the insulating layer 5, and electrodes are deposited on the conductive surface of glass layer 6.

A source for bias voltage $V_G$ is connected across the source region 3 and electrodes of the conductive surface of glass layer. A source for source-drain voltage $V_{SD}$ and an output resistance R are connected between the source region 3 and the drain region 4 across the gate region 2.

In preparation of the source region 3 and the voltage $V_G$ can be harmoniously adjusted so as to meet specific requirements from users. By selecting an appropriate wavelength $\lambda$ for excitation light, photocarrier density of the order, e.g., of $10^{12}/cm^3$ is obtainable in a surface layer of the gate region 2. With the above output current characteristics depending on the intensity of incident light, the superconductive optoelectronic device of FIG. 18 can be used as a superconductive switching device. The source region 3 and the drain region 4 made of superconductive oxide material are free from heat generation during operation, so that the optoelectronic device of FIG. 18 possesses those advantages which are inherent to superconductivity.

FIG. 19 is a partial schematic diagram of another embodiment of the superconductive optoelectronic device of the invention, which embodiment is an integrated circuit having a number of the superconductive optoelectronic devices of FIG. 18 formed on a common substrate 7 at a high density in the form of one- or two-dimensional arrays. If wiring among different devices in the integrated circuit of FIG. 19 is made by using superconducting material, heat generation in the arrays of the devices of FIG. 18 is suppressed to an extremely low level. The superconductive optoelectronic device and apparatus of the invention can be used in various fields; for instance, as a loss-free pick up (or camera) devices, loss-free detectors of optical signals in an optical computer which executes parallel operations in a spatially arranged manner, and the like. The device of the invention can be also used in a multiple channel system which selectively utilizes a number of different wavelengths in the incident light.

FIG. 20 schematically illustrates an optical calculation procedure in a projection-correlative optical system of a spac parallel optical computer in which system the superconductive optoelectronic devices of the invention are used. As a LED array like light source 10 projects a number of optical operating signals operation in parallel onto an encoded image-mask pattern 11. The image-mask pattern 11 carries a set of encoded image signals in a mask fashion, on which optical operation can be executed by signals carried by the light beams.

FIG. 20A shows a method for encoding space signals by using a transparent portion T and a non transparent portion N. FIG. 20B shows that the image mask pattern 11 may be formed by combining a set of input patterns 11A and 11B encoded into a first and a second input patterns 11A', 11B' and bringing the two encoded patterns 11A', 11B', in tight contact with each other.

After passing through the image-mask pattern 11, the light beams form a correlative optical image on screen 12 and then signals are transferred in parallel into the corresponding devices in a decoding mask element array 13. Each optical device receives a correlatively encoded signal at the screen 12 and decodes at the mask 13. Operated results can oe obtained from the optoelectronic output signals from each of the optical devices. If eac optical device in the screen and decoding mask optical element alley 12 and 13 is the superconductive optoelectronic device of the invention, space-parallel optical operations can be performed while minimizing heat generation during the highly space integrated operation.

Although the invention has been described so far by referring to an embodiment in the form of three-terminal device, the superconductive optoelectronic device of the invention can be also made in the form of a two-terminal device. More particularly, carriers generated under the condition of $V_G=0$ in a broad gate region are influenced by the superconductive proximity effect due to superconductive photoconductivity irrespective of a small coherence length in superconductive oxides, and one can expect that the superconductive optoelectronic device of the invention may be used as a superconductive Josephson junction device based on light irradiation. Thus, such two-terminal device may be treated as a "superconductive photoconductivity or optically controlled Josephson junction device". In this case, the gate width and the intensity of the incident light must be properly selected.

The illustrated embodiment of the invention is made by using a combination of the basic substance $Cu_2O$ and the superconductive Y-Ba-Cu-O system oxides, but other superconductive materials such as those of the La-Cu-O system, or Nd-Ce-Cu-O system can be also used to form the superconducting optoelectronic device and apparatus of the invention.

DISCUSSION

The detailed mechanism of the above photoconductive phenomena in the superconductive-conjugate photoconductive materials have not been fully clarified yet, but the inventor assumes it on the basis of the concepts of "polarons and excitons" as follows. A polaron is a freely moving conduction electron or a positive hole associated with LO-phonons or lattice deformations or even more generally with electronic polarization as schematically illustrated in FIG. 21A. There is also even a concept of "bipolaron" due to coherent electron-phonon interaction or electron-electron correlation effects as illustrated in FIG. 21B.

Figure 22A:
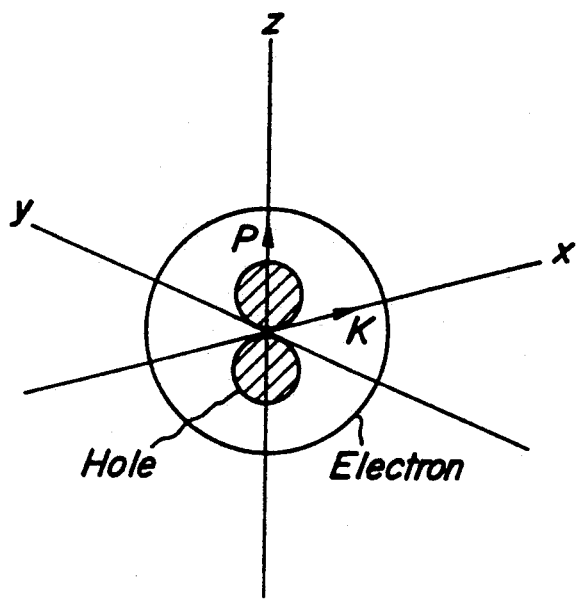
FIG. 22A illustrates a schematic form of an exciton with a wave vector K and transition moment P.
Figure 22B:
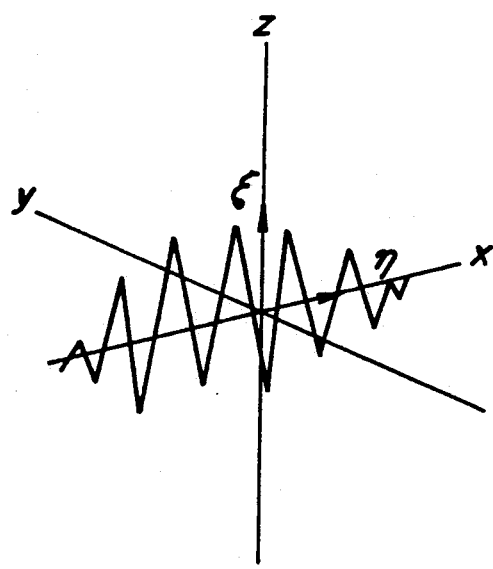
FIG. 22B illustrates a photon having a wave vector $\eta$ and a direction of polarization E which can couple with the exciton of FIG. 22A.

An exciton is an entity of elementary excitation as depicted in FIG. 22A which consists of a conduction electron and a positive hole bound together in an atomic hydrogen-like manner, sometimes, hybridized with (b) phonons to compose a "polariton".

The spectral response or photoresponse signal $Q(T,\lambda)$ of the curves (a) and (b) of FIGS. 2A and 2B implies that there exist such parts in the specimen of $Y_{3-x}$-$Ba_x$-$Cu_3$-$O_z$ system oxide which are similar to $Cu_2O$ in an atomic sense. The phenomena of optical absorption and photoconductivity of $Cu_2O$ have been fully clarified only in part, and such phenomena have been studied neither by experiments nor by the exciton theory. However, it is a typical example of Wannier type exciton that is related to and associated with mobile charge near cation shell with anions in neighbour. The positions of the fine structures in the photoresponse $Q(\lambda,T)$ in FIG. 4A to FIG. 4C basically coincide with those in the fundamental absorption edge of $Cu_2O$ itself. I can recognize a few prominent fine structures probably due to the excitons, e.g., structures around $\lambda \sim 570 \approx 620$ nm in the photoconductivity spectra of $Y_{3-x}$-$Ba_x$-$Cu_2$-$O_3$ similar to those of $Cu_2O$ single crystal, a structure of which appears to correspond to the n=2 state in a certain series of excitons of $Cu_2O$. Thus, I may reasonably conceive that there exists at least a finite fraction of the $Cu_2O$-like part or phase which cannot be ignored in the Y-Ba-Cu-O system substance, where the photoexcited electrons and holes are definitely mobile, irrespective of a certain difference of the crystal structures and the density of states (See FIGS. 23A to 23C).

A conduction electron or a positive hole in standard type of $Cu_2O$ crystals has been reported to form a rather large polaron. However, an onset of "photoconductivity" $Q(\lambda,T)$ even in the insulating specimens is clearly associated with an onset of "superconductivity" as if the superconductivity potentially underlies the photoconductivity phenomenon or vice versa. Thus, as to the effects of a polaron, whether it is a large polaron due to interaction with the LO-phonons, a small one due to the Jahn-Teller effect or possibly an intermediate one due to both effects, the effects of a polaron must be at least potentially important as indicated in FIGS. 2 to 17. Quite similar is "the electronically polarized polaron effect". This is particularly important for $Cu_2O$. They are probably effective in a coherently hybridized form of elementary excitations. Here, I must pay special attention to the electronically polarized polarons, which one may call an "excitonic polaron". No one can fail to recognize close association among polarons and excitons with the experimental data here.

Figure 23C:
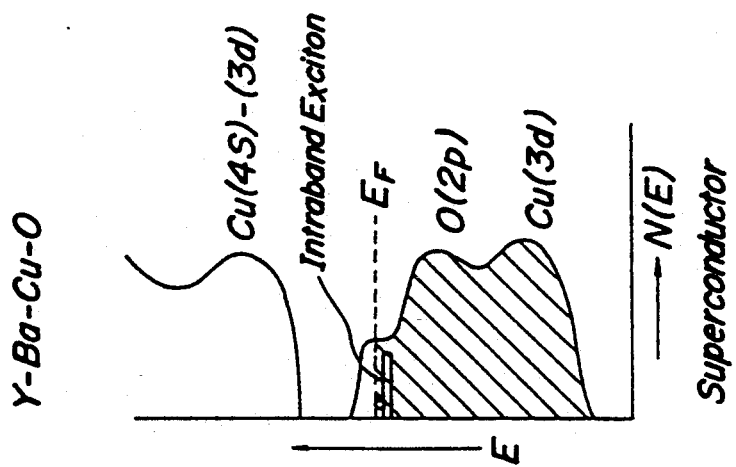
FIG. 23C is a schematic diagram of the density of states N(E) as a function of energy E for $Y_{3-x}Ba_xCu_3O_z$ (x=2)
Figure 23B:
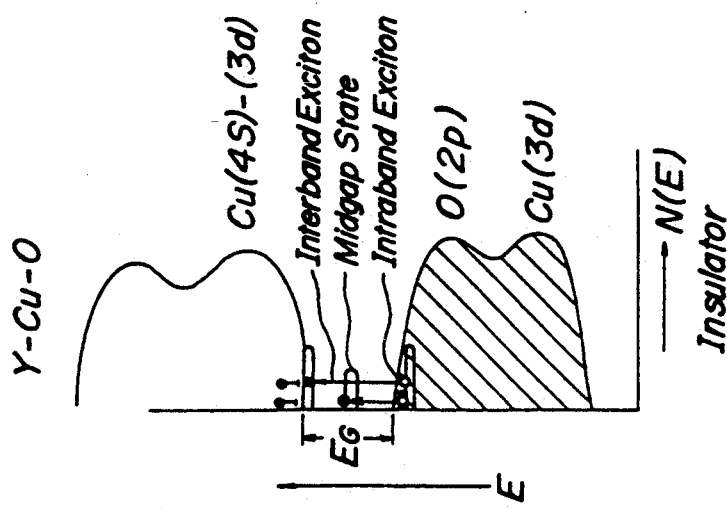
FIG. 23B is a schematic diagram of the density of states N(E) as a function of energy E for $Y_{3-x}Ba_xCu_3O_z$ (x=0)
Figure 23A:
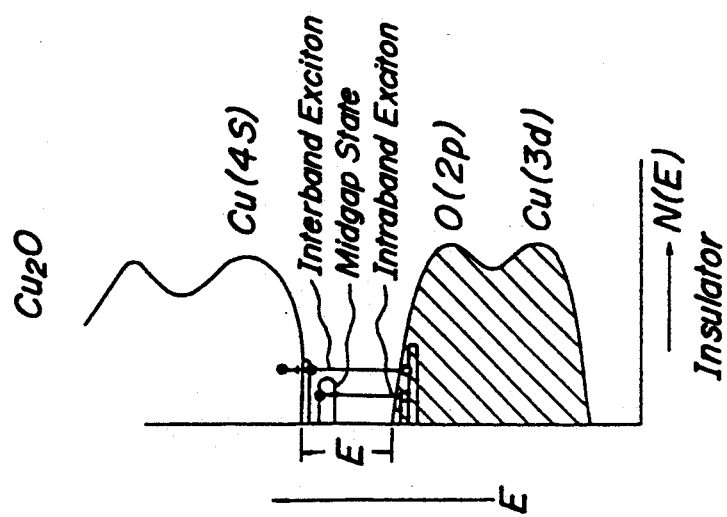
FIG. 23A is a schematic diagram of the density of states N(E) as a function of energy E for $Cu_2O$.

FIG. 23 indicate schematic energy levels of $Cu_2O$, Y-Cu-O and Y-Ba-Cu-O respectively. As shown in FIG. 23A, these polarons and excitons in the basic substance $Cu_2O$ had yielded out of the optical interband transition from the hybridized oxygen-(2p) and Cu-(3d) valence bands mainly to the Cu(4S) conduction band together with the LO-phonon interaction, while leaving $O(2p)^6Cu(3d)^9$ "holes" (represented by a white circle) and creating a $Cu(4S)^1$ conduction electron. However, a polaron in the Cu2O or substances of the Y-Ba-Cu-O system can be created either by an optical excitation or substitution of Ca with Sr (See FIGS. 23A for $Cu_2O$, 23B for x=0 and FIG. 23C for x=2). In the latter case, the substance becomes superconductive at x=2. Since the positive holes in the hybridized Cu(3d) and O(2p) bands can be created from the many-body ground state by either an intra- or inter-band transition, the electron correlation effects naturally important. One must pay more attention to the dynamical valence fluctuation between $Cu^{1+}$ and $Cu^{2+}$ with $O(2p)^6$, as well as between $Cu^{2+}$ and $Cu^{3+}$. Therefore, for the mechanism of high-temperature superconductivity, I may reasonably conceive potential roles of an ensemble of polarons, whether large or small, and especially closely associated excitons. The ensemble of united polarons and excitons here are probably a set of bipolarons, polaronic excitons and/or, most probably, "exciton-mediated bipolarons" due to the dynamical electron-phonon and electron correlation effects.

The photoresponse signals $Q(T,\lambda)$ of substances of the Y-Ba-Cu-O system as depicted by the curve (b) in FIG. 2 are very similar to those of $Cu_2O$ crystals of the curve in FIG. 2A. Consequently, I believe that these studies of elementary excitations here must reveal the nature of superconducting ground state, irrespective of different crystal structures and an enormous difference in carrier density. In both, an excited state via elementary excitation (insulator) in FIG. 23A and the ground state (superconductor) in FIG. 23B, one can expect occurrence of similar phenomena to those of the Josephson effect. Similar situations must be the case also for the La-Cu-O systems but with other reasoning such as deficiency or excess oxygen.

The phenomena of superconductive-conjugate photoconductivity Q(T) are considered to be due to an unexpected prolongation of "Schubweg" w(T), the mobility $\mu_d(T)$ times the life time $\tau_r(T)$, of positive holes or/and conduction electrons. Prolongation of Schubweg here means mainly sustained $\tau_r(T)$, which must be due to a reduction of the transition probability of recombination processes H', either radiative or nonradiative. This fact strongly reveals an occurrence of the conversion of holes states to escape from individual trapping and eventually of an inherent condensation of positive holes into new states. Here I discuss how such a condensation occurs at all in the following.

First, with decreasing temperature, the dark resistivity $\rho(T)$ of insulators becomes extremely high above $10^9$ $\Omega$.cm. Dark polarization signal due to complex $\kappa(T)$, however, is still observable only via transient charging current in the blocking electrode method over all host insulators here in common, as exemplified for $Cu_2O$ in FIG. 24a together with transient photoconductivity $Q(T,\lambda)$ at $\lambda=590$ nm in FIG. 24B. Similar data are displayed for $Y_3Cu_6O_3$ in FIGS. 24b and A. The dark signal varies with several bumps in steplike ways and with a prominent peak at a characteristic temperature. Dielectric anomalies in $\kappa(T)$ signifies an existence of either an existence of a series of peculiar type of deep level trapping centers or even an occurrence of phase transitions of the valence electron system. This means the many body ground state of insulators here $\Phi_{I,G}$ itself varies into a series of more stable and/or coherent states $\Phi_{I,CG}$ with decreasing T even before photoexcitation. As the phenomena are universal over all the host insulators herein the dark regardless of difference of crystal structures, they must reveal an existence of deep levels of intrinsic trapping centers or even an occurrence of the electronic phase transitions in any case in the O—1+$\delta$)—(Cu)+(1+$\gamma$)–(O)–(1–$\delta$) bond.

Secondly, the scattering mechanism of photocreated positive holes 100 K is mainly ruled by the low frequency soft LO phonons $\omega_1=153$ cm$^{-1}$ at the nearest neighbors as indicated in FIGS. 8A and 9. Naturally, I have to consider "the polaron effect" associated with the soft LO-phonons. The polaron effect has been noted also in cyclotron resonance experiments with apparently weak coupling constants. But, this is perhaps due to shielding by large relative value of optical dielectric constant $\kappa_{op}$ in comparison with that of the static dielectric constant $\kappa_s$. Namely, I must note that $Cu_2O$ is an ionic crystal potentially multivalent but hybridized with the nearest neighbours via covalent bonds. The term "polaron" also includes a concept of electronic polaron effect. Thus, a polaron in $Cu_2O$ at least below 100 K must be "a hybridized form of both LO phonon and electronic polaron".

Thirdly, as the most brief case, it has been definitely confirmed that the photoexcited state $\Phi_{I,ex}$ of $Cu_2O$ at low power levels of $\lambda_{ex}=700$ nm includes solely positive holes in the $\Gamma_7+$ valence band as mobile carriers. Thus, one can naively conceive an existence of positive hole polarons accompanied each by electronic polarization or CT-exciton state, whereas the most of photo-created localized-electrons at acceptor must be shielded by free holes. Here, the term "CT-exciton" does not mean a simple electron hole pair in the one-electron approximation but signifies a quantized form of elementary excitations around photocreated holes or trapped electrons themselves in multivalent valence band in the many body aspect. One may call such an entity "Charge Transfer (CT-) exciton". This is because photocreated free holes or localized electrons act in multivalent ionic insulators as the Quantum Well Potential Hole or Hill for other strongly correlated valence electrons. Because of the nonlinear optical growth of cyclotron resonance lines of both positive holes and electrons recently observed in FIGS. 16B and 16C, there emerges a possibility of bipolaron formation.

Therefore, if one consider such excitons induced by photocreated holes themselves in insulating $Cu_2O$ at $\lambda_{ex}=700$ nm, I can naively imagine that mobile positive holes must become of more ordered states via a coherent interaction among CT-excitons at $\phi_{I,ex}$ after photoexcitation. Basically, this is because the valence electron correlation effec induces a coherence with surprisingly high mobilities of polarons and excitons (above $10^5$, $10^7$ $cm^2/V.sec$ respectively) to lower a total of quasi free energy in the $O{-}^{(1+\delta)}{-}Cu^{+1}{-}O{-}^{(1+\epsilon)}{-}Cu^{+2}{-}O{-}^{1+\epsilon)}{-}Cu^{+1}{-}O{-}^{(1+\delta)}$ multivalence states unlike in usual Mott-insulators. Situations are quite similar to those at the ground state $\Phi_{S,G}$ of superconductive specimens of the Y-Ba-Cu-O and La-Cu-O systems by Ba-doping or oxidization as depicted in FIGS. 23A to 23C. I can reasonably speculate that such CT-excitons must mediate many hole polarons to coordinate a new coherently excited states $\phi_{I,Cex}$ with prolonged "Schubweg" or sustained life time. Above $T_{ps}$, the matrix element in the transition rate is finite, namely, $<\Phi_{I,G}|H'|\Phi_{I,ex}> \neq 0$, which brings free holes to individual trapping, a single hole recombination. Below $T_{ps}$, the prolongation of Schubweg derived from the data of $Q(T,\lambda)$ strongly suggests that there exists such a new coordinated state with an occurrence of unexpected recession of transition probability of many-holes trapping or recombination processes H' via the matrix element $<\Phi_{I,CG}|H'|\Phi_{I,Cex} \approx 0$ diminishing due to such coordinations. This is because of the inherent character changes of the $\phi_{I,G}$ into the new many body ground states of insulators $\phi_{I,CG}$ in the dark as revealed by dielectric anomalies in $\kappa(T)$ and of $\Phi_{I,ex}$ into $\Phi_{I,Cex}$ due to photocarriers coordinations also as suggested by emergences of Q(T) with decreasing T. If one recalls a series of remarkably sharp exciton absorption spectra $K(\lambda)$ of $Cu_2O$ in a hydrogenic style up to $n=4\sim5$ below 100 K or even $n=9$ at 1.6 K partially displayed in FIG. 4A, I can even reasonably conceive an existence of these dielectric phase transitions of the valence electronic system in this notable material $Cu_2O$. Thus, it is true irrespective of detailed natures of recombination processes of H', either radiative or non-radiative, as far as H' remains characteristic to individual trapping or recombination processes. I call such a coordination of positive holes to be "the coherently photoexcited condensation" at $|\Phi_{I,Cex}>$, the origin of anomalous photoconductivity here. One can regard that this is an assembly of "Charge Density Wave (CDW) states" with the main components of wave vectors around the half way to the Brillouin zone boundaries.

Finally, by contemplating over all experimental data of $\kappa(T)$ and $Q(T,\lambda)$ of $Cu_2O$ and, possibly via the Y-Cu-O $\rho(T)$ and M(T) of the Y-Ba-Cu-O, no one can doubt an existence of a clear correlation between Q(T) in $Cu_2O$ and $\rho(T)$ of the Y-Ba-Cu-O. Here, I can define a new concept of "superconductive-conjugate photoconductivity $Q(T,\lambda)$" in $Cu_2O$ in accordance or correspondence of step temperature $T_{ps}$ and the critical temperatures $T_{sc}$ of superconductivity in $\rho(T)$ of the Y-Ba-Cu-O. Thus, photodoping of positive holes in the Y-Cu-O is substantially equivalent to Ba-doping in the Y-Ba-Cu-O system. Neither of them is more substantial than the another. I can even convince ourselves that the superconductive-conjugate photoconductivity and the high-Tc superconductivity ar the phenomena really complementary with each other. They are possibly in common due to an inherently relevant condensation of positive holes into new states. I propose that a photoexcited state of the insulator of $Cu_2O$, Y-Cu-O or La-Cu-O system, $\phi_{I,Cex}$, is equivalent to the ground state of the high-Tc superconductors in the Y-Ba-Cu-O and the La-Cu-O systems $\Phi_{s,g}$. Insulator $Cu_2O$ is a basic substance or even host material continuously convertible to the Cu-based high-Tc superconductors in the Y-Cu-O either by Ba-, Sr-doping or at photoexcitation.

On an observed "Clew temperatures $T_{pc}$ in $n_p(T)$ or the step temperature $T_{ps}$ in Q(T) of $Cu_2O$ in FIG. 10, I give discussion as follows.

First, it is clear that, when excited at low power levels of $\lambda_{ex}=690-710$ nm, the experiments here of transient photoconductivity, hall mobility and cyclotron resonance in $Cu_2O$, indicate the sign of free positive holes in the $\Gamma_7+$ valence band for the dominant photocarriers. On the other hand, as noted via a trace of the electron spin resonance signal with the value of g=2.08 displayed here in FIG. 15, most of photoexcited electrons are trapped at local levels probably due to lattice defects such as copper vacancies or at induced mid-gap states. Thus, the photoconductivity of $Cu_2O$ excited at low power levels of $\lambda_{ex}=700$ nm can be ascribed to the free motion mainly of positive holes in the $\Gamma_7+$ valence band with anomalously prolonged Schubweg due to a type of condensation as discussed in the [B] part of discussion.

Secondly, as exemplified in FIG. 16, I have observed the nonlinear optical growth of individual cyclotron resonance lines of both positive holes and conduction electrons at high density excitation $P_{ex} \geq 100$ kW/cm$^{-2}$ and $\lambda_{ex}=690-750$ nm. This fact reveals a possibility of bipolaron formation for positive holes and electrons as will be discussed later in [①].

Thirdly, I can recognize a regular series of "Step Temperatures $T_{ps}$" in $Q(T,\lambda)$ or of "Clew Temperatures $T_{sc}$" in the density of photocreated positive holes $n_p(T)$ in FIG. 10. I notice a few particularly isolated but clear dip-like clews in $n_p(T)$ at T-145, 215-250 K. I leave these points to be discussed in future. In any case, these phenomena have been rarely observed in the normal photoconductivity.

What does such a regular series of $T_{ps}$ in Q(T) or $T_{pc}$ in $n_p(T)$ for free holes condensation in $Cu_2O$ at $\lambda_{ex}=700$ nm really mean? If I overwrite on the series of $T_{ps}$ or $T_{pc}$ a hydrogenic series of the interband exciton absorption spectra $K(\lambda)$ in a modified scale with the effective Rydberg energy $Ry_y*=608-612$ cm$^{-1}$ with $n=\infty$ at T=OK, one can discover an accor-dance of the series in $K(\lambda)$ with the newly observede regular series of $T_{ps}$ or $T_{pc}$ as displayed as a whole in FIG. 25. This procedure never means a infusion of the concepts of temperature and photon energy, but is useful to substantiate an entity only for anomalously recessed statistical distributions such as at the coherent ground and photoexcited states). A close fit reveals that the exciton binding energizes accords with the values of $T_{ps}$ or $T_{pc}$.

Here, with a photon at $\lambda=700$ nm, I have created a free positive hole only as a mobile entity with a localized electron left behind. However, a free hole itself possibly forms an electronic or excitonic polaron accompanied by excitons in the valence electronic system as discussed in [B]. Then, an ensemble of free hole polarons themselves created by selective optical excitation can be united to reduce the free energy by sharing the intraband charge transfer (CT)-excitons. Namely, they can form a coherent ensemble of the excitonic polarons via the CT-excitons in the Cu-O-Cu network of multivalent states in insulators at photoexcitation. Thus, an occurrence of series of $T_{ps}$ or $T_{pc}$ above may be associated with a type of condensation of photocreated positive holes in real space.

Actually, an empirical value of $R_y^* = -\mu^* e^4/2(4\pi\kappa_{eff})^2/\kappa 2$ gives a realistic value of $\kappa_{eff} = 7.86-7.89$ together with the value of reduced mass $\mu^* = 0.345$ of an intraband exciton obtained from the observed mass of holes $m^*_h$ in the cyclotron resonance experiment. This value of $\kappa_{eff}$ is rather close to the static dielectric constant and may suggest a subsidiary inclusion of the TO- or LO-phonon isotope effect in $Cu_2O$.

Such a new conjecture of regular series of $T_{ps}$ and $T_{pc}$ with the quantum numbers [n,l] in an exciton-like style can be supported by another experimental fact on a series of successive emergence of steps in Q(T) at lower temperatures. As exemplified in FIG. 10, one recognizes an enhanced appearance of $T_{ps}$ in Q(T) with lifting the degeneracy starting from larger [n,l]-states to smaller [n,l]-states with increasing the applied electric field up to $E=1.34$ kV/cm in comparison with Qx(T) at $E=2.5$ V/cm in FIG. 8A. This fact is probably due to higher dielectric polarizability of larger [n,l]-states of an intraband exciton. Situations are quite similar to "the Stark effect" in an atomic system.

Finally, these steps $T_{ps}$ or clews $T_{pc}$ in $Cu_2O$ at photoexcitation possibly have a close conjugation with the critical temperatures $T_{pc}$ of the high-$T_c$ super-conductivity in the Cu-based oxide systems. Thus, an adjustable commensuration between the lattice parameters and exciton radius with crystal field symmetry may be substantial not only to select a set of adequate values of the principal and total orbital angular momentum quantum numbers [n,1] of excitons in host insulators at photoexcitation but also to stabilize the critical temperatures of related superconductors. I can further speculate that the variety of $T_c$-values is simply a result of "an excitonic isomer shift" due to a series of charge transfer excitonic states in the Cu-based oxide compounds, if the CT-exciton mediated bipolaron mechanism rules all the critical temperatures of the high-To superconductivity of Cu-based oxide systems. Here, I propose a realistic path via the photoconductivity in $Cu_2O$ to the superconductivity in all the Cu-based oxides systems.

By carefully analyzing details of the data of temperature dependences of the photoconductivity $Q(T,\lambda)$ and the Hall mobility $\mu_H(T)$ of photoexcited positive holes in $Cu_2O$, I have recognized in $Cu_2O$ for the first time a novel quantized series of "Step Temperatures $T_{ps}$" in $Q(T,\lambda)$ at $\lambda=590$ nm or of "Clew Temperatures $T_{pc}$ in the density of photoexcited positive holes $n_p(T)$ at low power levels of $\lambda_{ex}=700$ nm as temperature decreases. I can notice a few isolated but clear dip-like clews of $n_p(T)$ at T=145, 215, 230 and 250 K. A novel quantized series of the values of $T_{ps}$ or $T_{pc}$ may be ruled by a type of condensation of photoexcited free positive holes into a new mobile state in real space in accordance or correspondence with superconductive $T_{sc}$. In a view of the superconductive-conjugate photoconductivity in host insulator, this condensation occurs probably with the intraband charge transfer CT-excitons selectively created via optical excitations at $\lambda=590$ and 700 nm in common. Here, with a concept of the superconductive-conjugate photoconductivity of $Cu_2O$, I propose that "the excitonic isomer shifts" can explain the variety of $T_{sc}$-values of the Cu-based oxide high-$T_c$ superconductors.

Last on the microwave photosignals, I give discussion as follows.

First, an anomalous temperature dependence of microwave photo signal $Q\omega(T)$ suggests an occurrence of prolongation of life time of photocreated carriers at least in part in $Cu_2O$ with decreasing temperature. This is quite in contrast to that in most of normal microwave photoconductors, where the life time of photocarriers usually exponentially decreases with T due to trapping of individual carriers. Similar temperature dependences have been observed in transient photoconductivity of $Cu_2O$ and also in host insulators of high-Tc superconductors such as Y-Cu-O and La-Cu-O.

Secondly, I have discovered an unexpected emergence of an additional cyclotron resonance line with increasing photon flux even at the mid-gap excitation of $\lambda_{ex}=690$, 735 nm as illustrated in FIGS. 16B, 16C. I naively ascribe this line to conduction electrons. This is supported also by the $Q_y$ measurement. These are clearly nonlinear optical phenomena observed for the first time in the cyclotron resonance experiment of $Cu_2O$. It is by no means easy to explain the mechanism of such remarkable phenomena in a simple manner. Here, I examine four possible processes; [1] Saturation effect of hole trapping centers at high density excitation, [2] Two-photon interband excitation, [3] Two-photon excitation via trapping center for valence electrons, and [4] Bipolaron formations as illustrated in FIG. 17.

Process [1] can be considered to be the most naive. But, a reasonable number of such trapping centers must be normally large, e.g., of the order of $10^{18}$ in comparison with photon numbers at excitation, especially at $\lambda_{ex}\geq 690$ nm with rather small absorption constant. Thus, the saturation effect can be hardly expected. Process [2] stands as an intrinsic candidate. However, this type of possibility may be excluded because of the fact that no phenomena can be observed at $\lambda_{ex}=620-630$ nm which is also a mid-gap excitation and the two-photon energy still remains in the interband region between the bottom and top of the conduction band. Process [3] may sound unlikely. Nevertheless, the energy for $\lambda_{ex}=735$ nm almost coincides with the exitation energy of valence electrons to the Cu-vacancy pair, the $V_{Cu}-V_{Cu}$ levels. So far, however, there has been observed no particular absorption line at $\lambda_{ex}=735$ nm. On the other hand, it is well known that, once I create a positive hole in the valence band of the Cu-based oxides compounds, I induce also a mid-gap state. This can be a reasonable candidate to explain the newly observed nonlinear optical phenomena here.

If I carefully consider the $\lambda$-dependences of cyclotron resonance line peak $Q\omega(T,\lambda,H_c)$ of holes and electron due to Processes [2] and [3] in detail, especially [3]

with either a fast o slow step at double acceptors such as an induced mid-gap state, I readily obtain an expected result of $P_{ex}$-dependence of each resonance peak. A fast step signifies a two step process via acceptors such as mid-gap states, whereas a slow step reveals an existence of double acceptors possibly with a large negative U due to the strong electron correlation effect also at the mid-gap state. By comparing these results, the most probable for $\lambda_{ex}=735$ nm are the case of medium hybridization, where both fast and slow steps contribute in a hybridized way in Process [3].

Finally, because of the nonlinear optical growth of the cyclotron resonance line of both positive holes and electrons at $\lambda_{ex}=735$ nm, there emerges a possibility of Process [4] Bipolaron formation. This sounds first not to be probable. But, no one can ignore the fact that the simultaneous nonlinear optical growth of both holes and electrons cyclotron resonance lines reveals a coexistence of real entitles created either by a series of two-photon absorption via virtual intermediate state or by two-photon parallel absorption to yield two particle excitation to a virtual double acceptor with deep levels and finally dynamical motion of these entitles with high mobility. Via a series type excitation, however, I can expect the nonlinear optical growth of cyclotron resonance lines for photocreated carriers only in the final state but not in the initial state. Thus, the two-photon parallel excitation also can be a candidate to create these photo-induced entitles here. Accordingly, I speculate that these entitles can be "bipolarons" as proposed for organic conductors, if I may assume $\omega_c=(eH/m^*c)=(2e/2m^*c)\sim(e_{bp}H/m^*_{bp}C)$, where $e_{bp}, m_{bp}$ are the bipolaronic charge and mass either for holes or electrons. I can conceive this situation may be due to a coherent state because the line width of cyclotron resonance at $\lambda_{ex}=735$ nm in FIG. 16B is sufficiently sharp even at high density excitation free from plasma-shift. No contribution of excitons can be expected in the resonant part of the cyclotron resonance absorption. Recall that the dynamical motion of photo-carriers in the cyclotron resonance absorption does signify an existence of nonlinear optical growth of orbital diamagnetism.

Thus, I tentatively ascribe the phenomena to a hybridized set of Processes [3] and [4]. This scheme is compatible with the sustained life time of photocarriers and possibly leads us to an idea of the bipolaron formation due to double acceptors probably with a negative correlation energy.

I have performed a cyclotron resonance experiment of $Cu_2O$ at $f=35$ GHz, $T=4.2$ K and especially at $\lambda_{ex}\geq690$ nm with high density excitation photon flux. Anomalous temperature dependence of microwave photosignal with decreasing temperature suggests an intrinsically sustained life time of photocarriers below 110 K. In the cyclotron resonance spectra, I have discovered a new surprisingly nonlinear optical growth of each resonance line of both holes and electrons even at the mid-gap excitation $\lambda_{ex}=735$ nm. Therefore, these nonlinear optical phenomena of both positive holes and electrons dependent individually on $P_{ex}$ possibly reveal an existence of peculiar type of deep levels such as due to double acceptors eventually associated with a bipolaron formation in $Cu_2O$ at the mid-gap excitation.

Finally, after of overall discussions, I give a few of important remarks. As indicated in FIGS. 25A and 25B, I can designate a series of the step temperatures $T_{ps}$ in $Q(T,\lambda)$ and of the critical temperatures $T_{sc}$ in $\rho(T)$ of all the Cu-based oxide compounds mainly in terms of the principal quantum, number n of an exciton by a formula, $$k_B T_c = \frac{\mu^* e^4}{2(4\pi\kappa_{eff})^2 \hbar^2} \cdot \left(\frac{1}{n^2}\right), \quad (1)$$

where $\mu^*$ and $\kappa_{eff}$ are the reduced mass of an intraband exciton and the effective dielectric constant of the basic substance $Cu_2O$, respectively, with others which are all the universal constants. Degeneracy with respect to the angular momentum quantum number l may be lifted due to a variety of the crystal structures with field symmetry, external fields or chemical pressure etc.

With such a conjecture, I can comprehend why the critical temperatures $T_{sc}$ of the Cu-based superconductive oxides have raised so rapidly since 1986 after the historic discovery by Bednorz-Mueller. I can even forecast the critical temperature $T_{sc}$ to be discovered in future on the basis of the formula (1). However, perhaps due to an existence of strong exciton-phonon interaction above 110 K, it may be by no means easy to find a new high-$T_c$ Cu-based oxide compound.

To the best of our knowledge, this is the first clear experimental indications of the polaron and exciton mechanisms and of substantial roles of the basic substance $Cu_2O$ in the high-temperature superconductivity of all the Cu-based oxides such as Y-Cu-O, Y-Ba-Cu-O, La-Cu-O, and Nd-Ce-Cu-O systems.

Our final aim is to pursue an existence of the "Photo Induced Superconductivity" by u ing the basic substance $Cu_2O$ and achieve a new innovation of "the Superconductive Optoelectronics".

As described in detail in the foregoing, a superconductive optoelectronic device according to the invention comprises a source region, a drain region, the two regions being made of the Cu-based superconductive material, and a gate region made of "the basic substance $Cu_2O$ of superconductive-conjugate photoconductivity" revealing photoconductivity at a temperature below the transition temperature of the above Cu-based superconductive oxide material. Thus, the invention provides an optoelectronic device with intrinsic "superconductive properties", i.e., extremely low generation rate of heat such as Joule heat during operation, and it facilitates development of various novel superconducting devices such as "an optically controllable superconductive Josephson junction devices", "superconductive phototransistors", and even "opto-neural elements".

Further, a two-dimensional array-like device with a high density integration of the superconductive optoelectronic devices of the invention has such electrodes and lead wire terminals which are of perfect diamagnetism, so that it is free from noises and interferences due to mutual electromagnetic induction between adjacent devices or due to outside magnetic fields. Therefore, the invention enables production of an ideal "superconductive optoelectronic device or apparatus" which operates under optimum thermal and electromagnetic conditions, thus in various forms of integration at ultrahigh density such as a space parallel optical computer with a very high operating speed.

In short, the present invention is an effective pioneer in novel scientific field of "Superconductive Optoelectronics".

Although the invention has been described with a certain degree of particularity on the basic substance $Cu_2O$, it must be understood that the present disclosure has been made only by way of example and that numerous variations in details may be resorted to without departing from the scope of the invention as hereinafter claimed.

What is claimed is:

1. A superconductive optoelectronic device comprising, a substrate, a photoconductive gate region formed on the substrate, a source region and a drain region formed on the substrate at opposite sides of the gate region respectively so as to face toward each other across the gate region, and means for supplying bias voltage between said source region and drain region, said source and drain regions comprising a Cu-based superconductive oxide material, said gate region consisting essentially of the basic substance $Cu_2O$ having a superconductive-conjugate photoconductivity which reveals photoconductivity at a temperature below the critical temperature for superconductivity of said superconductive material, whereby an electric current flowing between said source region and said drain regions is controlled in accordance with intensity of light which is made incident upon the gate region.

2. The superconductive optoelectronic device as set forth in claim 1, wherein the photoconductive gate region consists essentially of the basic substance $Cu_2O$ of superconductive-conjugate photoconductivity and said source region and said drain region each consists essentially of a superconductive oxide material having a general chemical formula of $Y_{3-x}$-$Ba_x$-$Cu_y$-$O_z$ with $1 \leq x \leq 2, y=3, 6.5 \leq z \leq 7.$ 3. The superconductive optoelectronic device as set forth in claim 1, wherein the photoconductive gate region consists essentially of the basic substance $Cu_2O$ of superconductive-conjugate photoconductivity and said source region and said drain region each consists essentially of a superconductive oxide material having a general chemical formula of $La_2$-$Cu_1$-$O_z$ with $3.92 \leq z \leq 4.02.$ 4. The superconductive optoelectronic device as set forth in claim 1, wherein the photoconductive gate region consists essentially of the basic substance $Cu_2O$ of superconductive-conjugate photoconductivity and said source region and said drain region each consists essentially of a superconductive oxide material having a general chemical formula of $Nd_{2-x}$-$Ce_x$-$Cu$-$O_z$ with $x=0.15, 3.96 \leq z \leq 4.02.$ 5. The superconductive optoelectronic device comprising a plurality of superconductive optoelectronic devices as set forth in claim 2 arranged in the form of an integrated array.

6. The superconductive optoelectronic device comprising a plurality of superconductive optoelectronic devices as set forth in claim 3 arranged in the form of an integrated array.

7. The superconductive optoelectronic device comprising a plurality of superconductive optoelectronic devices as set forth in claim 4 arranged in the form of an integrated array.

8. The superconductive optoelectronic device comprising a plurality of superconductive optoelectronic devices as set forth in any one of claims 5 to 7 arranged in the form of a two-dimensional array.

9. The superconductive optoelectronic device as set forth in claim 2, further comprising means for supplying bias voltage $V_G$ between the gate region and source region.

10. The superconductive optoelectronic device as set froth in claim 9, wherien $V_G \neq 0$.

11. The superconductive optoelectronic device as set forth in claim 9, wherein $V_G = 0$.

12. The superconductive optoelectronic device as set forth in claim 3, further comprising means for supplying bias voltage $V_G$ between the gate region and source region.

13. The superconductive optoelectronic device as set forth in claim 12, wherein $V_G \neq 0$.

14. The superconductive optoelectronic device as set forth in claim 12, wherein $V_G = 0$.

15. The superconductive optoelectronic device as set forth in claim 4, further comprising means for supplying bias voltage $V_G$ between the gate region and source region.

16. The superconductive optoelectronic device as set forth in claim 15, wherein $V_G \neq 0$.

17. The superconductive optoelectronic device as set forth in claim 15, wherein $V_G = 0$.

* * * * *